United States Patent
Lin et al.

(10) Patent No.: US 9,018,667 B2
(45) Date of Patent: Apr. 28, 2015

(54) SEMICONDUCTOR CHIP ASSEMBLY WITH POST/BASE HEAT SPREADER AND DUAL ADHESIVES

(75) Inventors: Charles W. C. Lin, Singapore (SG); Chia-Chung Wang, Hsinchu (TW); Sangwhoo Lim, Johor (MY)

(73) Assignee: Bridge Semiconductor Corporation, Taipei (TW)

( * ) Notice: Subject to any disclaimer, the term of this patent is extended or adjusted under 35 U.S.C. 154(b) by 779 days.

(21) Appl. No.: 12/758,040

(22) Filed: Apr. 12, 2010

(65) Prior Publication Data
US 2010/0193830 A1 Aug. 5, 2010

Related U.S. Application Data

(63) Continuation-in-part of application No. 12/616,773, filed on Nov. 11, 2009, now Pat. No. 8,067,784, which is a continuation-in-part of application No. 12/557,540, filed on Sep. 11, 2009, now Pat. No. 8,378,372, which is a continuation-in-part of application No. 12/406,510, filed on Mar. 18, 2009, now abandoned, said application No. 12/616,773 is a continuation-in-part of application No. 12/557,541, filed on Sep. 11, 2009, which is a continuation-in-part of application No. 12/406,510, application No.

(Continued)

(51) Int. Cl.
| | |
|---|---|
| *H01L 23/367* | (2006.01) |
| *H01L 21/48* | (2006.01) |
| *H01L 23/495* | (2006.01) |
| *H05K 1/02* | (2006.01) |

(Continued)

(52) U.S. Cl.
CPC ........ *H01L 21/486* (2013.01); *H01L 23/49575* (2013.01); *H01L 23/3677* (2013.01); *H01L 33/483* (2013.01); *H01L 33/642* (2013.01); *H01L 2224/32188* (2013.01); *H01L 2224/48091* (2013.01); *H01L 2224/48227* (2013.01); *H01L 2224/49171* (2013.01); *H01L 2924/01012* (2013.01); *H01L 2924/01046* (2013.01); *H01L 2924/01078* (2013.01); *H01L 2924/01079* (2013.01); *H01L 2924/19041* (2013.01); *H05K 1/0204* (2013.01); *H05K 3/0061* (2013.01); *H05K 3/386* (2013.01); *H05K 2201/09054* (2013.01); *H05K 2201/10106* (2013.01); *H05K 2201/10969* (2013.01); *H01L 2924/01019* (2013.01); *H01L 2924/01087* (2013.01); *H01L 2224/45144* (2013.01); *H01L 2924/12041* (2013.01)

(58) Field of Classification Search
CPC ................... H01L 23/3677; H01L 23/49575
USPC .............................. 257/98, 99; 438/22, 25, 26
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |

(Continued)

FOREIGN PATENT DOCUMENTS

JP 2005-166775 6/2005 ............ H01L 33/00

*Primary Examiner* — Phat X Cao
(74) *Attorney, Agent, or Firm* — Jackson IPG PLLC

(57) ABSTRACT

A semiconductor chip assembly includes a semiconductor device, a heat spreader, a conductive trace and first and second adhesives. The semiconductor device is electrically connected to the conductive trace and thermally connected to the heat spreader. The heat spreader includes a post and a base. The post extends upwardly from the base through an opening in the first adhesive, and the base extends laterally from the post. The first adhesive extends between the base and the conductive trace and the second adhesive extends between the post and the conductive trace. The conductive trace provides signal routing between a pad and a terminal.

45 Claims, 27 Drawing Sheets

Related U.S. Application Data

12/758,040, which is a continuation-in-part of application No. 12/616,775, filed on Nov. 11, 2009, now abandoned, which is a continuation-in-part of application No. 12/557,540, which is a continuation-in-part of application No. 12/406,510, said application No. 12/616,775 is a continuation-in-part of application No. 12/557,541, which is a continuation-in-part of application No. 12/406,510.

(60) Provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009, provisional application No. 61/263,826, filed on Nov. 24, 2009.

(51) Int. Cl.
    *H01L 33/48* (2010.01)
    *H01L 33/64* (2010.01)
    *H05K 3/00* (2006.01)
    *H05K 3/38* (2006.01)

(56) References Cited

U.S. PATENT DOCUMENTS

| | | | | |
|---|---|---|---|---|
| 4,420,767 A | 12/1983 | Hodge et al. | | 257/713 |
| 4,509,096 A | 4/1985 | Baldwin et al. | | 257/706 |
| 5,012,386 A | 4/1991 | McShane et al. | | 361/386 |
| 5,102,829 A | 4/1992 | Cohn | | 437/217 |
| 5,457,605 A | 10/1995 | Wagner et al. | | 361/720 |
| 5,543,586 A | 8/1996 | Crane, Jr. et al. | | 174/262 |
| 5,644,163 A | 7/1997 | Tsuji | | 257/706 |
| 5,991,156 A | 11/1999 | Bond et al. | | 361/707 |
| 6,057,601 A | 5/2000 | Lau et al. | | 257/738 |
| 6,160,705 A | 12/2000 | Stearns et al. | | 361/704 |
| 6,245,696 B1 | 6/2001 | Haas et al. | | 442/338 |
| 6,313,525 B1 | 11/2001 | Sasano | | 257/704 |
| 6,495,914 B1 | 12/2002 | Sekine et al. | | 257/723 |
| 6,500,529 B1 | 12/2002 | McCarthy et al. | | 428/209 |
| 6,507,102 B2 | 1/2003 | Juskey et al. | | 257/406 |
| 6,528,882 B2 | 3/2003 | Ding et al. | | 257/738 |
| 6,541,832 B2 | 4/2003 | Coyle | | 257/415 |
| 6,583,444 B2 | 6/2003 | Fjelstad | | 257/82 |
| 6,603,209 B1 | 8/2003 | DiStefano et al. | | 257/781 |
| 6,625,028 B1 | 9/2003 | Dove et al. | | 361/707 |
| 6,670,219 B2 | 12/2003 | Lee et al. | | 438/107 |
| 6,683,795 B1 | 1/2004 | Yoo | | 361/816 |
| 6,720,651 B2 | 4/2004 | Gaku et al. | | 257/707 |
| 6,900,535 B2 | 5/2005 | Zhou | | 257/707 |
| 6,906,414 B2 | 6/2005 | Zhao et al. | | 257/707 |
| 6,936,855 B1 | 8/2005 | Harrah | | 257/88 |
| 6,964,877 B2 | 11/2005 | Chen et al. | | 438/20 |
| 7,038,311 B2 | 5/2006 | Woodall et al. | | 257/706 |
| 7,196,403 B2 | 3/2007 | Karim | | 257/675 |
| 7,335,522 B2 | 2/2008 | Wang et al. | | 438/26 |
| 7,470,935 B2 | 12/2008 | Lee et al. | | 257/98 |
| 7,582,951 B2 | 9/2009 | Zhao et al. | | 257/660 |
| 7,642,137 B2 | 1/2010 | Lin et al. | | 438/127 |
| 7,690,817 B2 | 4/2010 | Sanpei et al. | | 362/294 |
| 7,741,158 B2 | 6/2010 | Leung et al. | | 438/122 |
| 7,781,266 B2 | 8/2010 | Zhao et al. | | 438/123 |
| 7,808,087 B2 | 10/2010 | Zhao et al. | | 257/670 |
| 7,956,372 B2 | 6/2011 | Kamada et al. | | 257/98 |
| 2003/0189830 A1 * | 10/2003 | Sugimoto et al. | | 362/294 |
| 2004/0061433 A1 | 4/2004 | Izuno et al. | | 313/498 |
| 2004/0065894 A1 | 4/2004 | Hashimoto et al. | | 257/100 |
| 2005/0135105 A1 | 6/2005 | Teixeira et al. | | 362/294 |
| 2005/0185880 A1 | 8/2005 | Asai | | 385/14 |
| 2006/0012967 A1 | 1/2006 | Asai et al. | | 361/764 |
| 2006/0054915 A1 | 3/2006 | Chang | | 257/100 |
| 2006/0109632 A1 | 5/2006 | Berlin et al. | | 361/719 |
| 2006/0131735 A1 | 6/2006 | Ong et al. | | 257/706 |
| 2007/0063213 A1 | 3/2007 | Hsieh et al. | | 257/99 |
| 2007/0077416 A1 | 4/2007 | Ito et al. | | 428/339 |
| 2007/0252166 A1 | 11/2007 | Chang et al. | | 257/98 |
| 2007/0267642 A1 | 11/2007 | Erchak et al. | | 257/98 |
| 2007/0290322 A1 | 12/2007 | Zhao et al. | | 257/690 |
| 2008/0019133 A1 | 1/2008 | Kim et al. | | 362/294 |
| 2008/0099770 A1 | 5/2008 | Mendendorp et al. | | 257/79 |
| 2008/0102631 A1 | 5/2008 | Andryushchenko et al. | | 438/686 |
| 2008/0173884 A1 | 7/2008 | Chitnis et al. | | 257/98 |
| 2008/0180824 A1 | 7/2008 | Endoh et al. | | 359/894 |
| 2010/0149756 A1 | 6/2010 | Rowcliffe et al. | | 361/714 |
| 2011/0133204 A1 | 6/2011 | Lai | | 257/76 |

\* cited by examiner

SEMICONDUCTOR CHIP ASSEMBLY WITH POST/BASE HEAT SPREADER AND DUAL ADHESIVES

CROSS-REFERENCE TO RELATED APPLICATIONS

This application is a continuation-in-part of U.S. application Ser. No. 12/616,773 filed Nov. 11, 2009, which is incorporated by reference. This application is also a continuation-in-part of U.S. application Ser. No. 12/616,775 filed Nov. 11, 2009, which is incorporated by reference. This application also claims the benefit of U.S. Provisional Application Ser. No. 61/263,826 filed Nov. 24, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a heat spreader, a conductive trace and dual adhesives and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multilayer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and first and second adhesives. The semiconductor device is electrically connected to the conductive trace and thermally connected to the heat spreader. The heat spreader includes a post and a base. The post extends upwardly from the base through an opening in the first adhesive, and the base extends laterally from the post. The first adhesive extends between the base and the conductive trace and the second adhesive extends between the post and the conductive trace. The conductive trace provides signal routing between a pad and a terminal.

In accordance with an aspect of the present invention, a semiconductor chip assembly includes a semiconductor device, a heat spreader, a conductive trace and first and second adhesives. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The conductive trace includes a pad and a terminal. The first adhesive includes an opening, contacts the second adhesive at an adhesive interface and extends laterally from the adhesive interface in the lateral directions. The second adhesive extends upwardly from the adhesive interface above the first adhesive in the upward direction.

The semiconductor device is above and overlaps the post, is electrically connected to the pad and thereby electrically connected to the terminal, and is thermally connected to the post and thereby thermally connected to the base. The first adhesive is mounted on and extends above the base, extends between the conductive trace and the base and extends laterally from the adhesive interface to or beyond the terminal. The second adhesive extends into a gap between the post and the pad. The pad is mounted on the first adhesive and extends above the base. The post extends through the opening, and the base extends below the semiconductor device and the pad.

The conductive trace can include the pad, the terminal and a routing line, an electrically conductive path between the pad and the terminal can include the routing line and the pad, the terminal and the routing line can contact and overlap the first adhesive.

In accordance with another aspect of the present invention, a semiconductor chip assembly includes a semiconductor device, a heat spreader, a substrate and first and second adhesives. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a dielectric layer, and an aperture extends through the substrate. The conductive trace includes a pad and a terminal. The first adhesive includes an opening, contacts the second adhesive at an adhesive interface and extends laterally from the adhesive interface in the lateral directions. The second adhesive extends upwardly from the adhesive interface above the first adhesive in the upward direction.

The semiconductor device is above and overlaps the post, is electrically connected to the pad and thereby electrically connected to the terminal, and is thermally connected to the post and thereby thermally connected to the base. The first adhesive is mounted on and extends above the base, extends laterally from the post to or beyond the terminal and is sandwiched between the base and the substrate. The second adhesive extends into a gap in the aperture between the post and the substrate, extends laterally from the post to or beyond the terminal and is sandwiched between the post and the dielectric layer. The substrate is mounted on the first adhesive and extends above the base. The post extends through the opening into the aperture, and the base extends below the semiconductor device, the substrate and the adhesives.

The heat spreader can consist of the post and the base. The heat spreader can also consist of copper, aluminum or copper/nickel/aluminum. In any case, the heat spreader provides heat dissipation and spreading from the semiconductor device to the next level assembly.

The semiconductor device can be mounted on the heat spreader. For instance, the semiconductor device can be mounted on the post and the substrate, overlap the post and the pad, be electrically connected to the pad using a first solder joint and be thermally connected to the post using a second solder joint. Alternatively, the semiconductor device can be mounted on the post but not the substrate, overlap the post but not the substrate, be electrically connected to the pad using a wire bond and be thermally connected to the post using a die attach.

The semiconductor device can be a packaged or unpackaged semiconductor chip. For instance, the semiconductor device can be an LED package that includes an LED chip, is mounted on the post and the substrate, overlaps the post and the pad, is electrically connected to the pad using a first solder joint and is thermally connected to the post using a second solder joint. Alternatively, the semiconductor device can be a semiconductor chip that is mounted on the heat spreader but not the substrate, overlaps the post but not the substrate, is electrically connected to the pad using a wire bond and is thermally connected to the post using a die attach.

The first adhesive can be an adhesive tape. The first adhesive can also provide the primary mechanical bond between the heat spreader and the substrate. The first adhesive can also contact the base and the dielectric layer outside the gap. The first adhesive can also cover the substrate in the downward direction, surround the post in the lateral directions and cover the base outside the post in the upward direction. The first adhesive can also conformally coat a top surface of the base outside the post. The first adhesive can also fill the space between the base and the substrate and be contained in the space between the heat spreader and the substrate.

The first adhesive can extend laterally from the post to or beyond the terminal. For instance, the first adhesive and the terminal can extend to peripheral edges of the assembly. In this instance, the first adhesive extends laterally from the post to the terminal. Alternatively, the first adhesive can extend to peripheral edges of the assembly and the terminal can be spaced from the peripheral edges of the assembly. In this instance, the first adhesive extends laterally from the post beyond the terminal.

The first adhesive can be overlapped by the conductive trace. For instance, the pad and the terminal can extend above and overlap the dielectric layer. In this instance, the first adhesive is overlapped by the pad and the terminal and the assembly provides horizontal signal routing between the pad and the terminal. Alternatively, the pad can extend above and overlap the dielectric layer and the terminal can extend below and be overlapped by the dielectric layer. In this instance, the first adhesive is overlapped by the pad and overlaps the terminal and the assembly provides vertical signal routing between the pad and the terminal.

The second adhesive can be a solder mask. The second adhesive can also selectively expose the post, the pad and the terminal. The second adhesive can also provide a secondary mechanical bond between the heat spreader and the substrate. The second adhesive can also contact the post and the dielectric layer in the gap. The second adhesive can also surround the post in the lateral directions. The second adhesive can also conformally coat the sidewalls of the post. The second adhesive can also extend across most or all of the dielectric layer in the gap. The second adhesive can also fill the space between the post and the dielectric layer, or alternatively, the second adhesive can fill nearly all of the space in the gap and have a curved top surface that extends below the pad between the post and the dielectric layer in the gap.

The second adhesive can extend laterally from the post to or beyond the terminal. For instance, the second adhesive and the terminal can extend to peripheral edges of the assembly. In this instance, the second adhesive extends laterally from the post to the terminal. Alternatively, the second adhesive can extend to peripheral edges of the assembly and the terminal can be spaced from the peripheral edges of the assembly. In this instance, the second adhesive extends laterally from the post beyond the terminal.

The second adhesive can overlap the conductive trace. For instance, the pad, the terminal and the routing line can extend above and overlap the dielectric layer. In this instance, the second adhesive overlaps the routing line and the assembly provides horizontal signal routing between the pad and the terminal. Alternatively, the pad and the routing line can extend above and overlap the dielectric layer and the terminal can extend below and be overlapped by the dielectric layer. In this instance, the second adhesive overlaps the routing line and the terminal and the assembly provides vertical signal routing between the pad and the terminal.

The first and second adhesives can each surround the post in the lateral directions. In addition, the first and second adhesives in combination can cover the post in the lateral directions. For instance, the second adhesive can extend between the first adhesive and the post, contact the base and cover the post in the lateral directions. In this instance, the first adhesive is spaced from the post, the second adhesive covers the post in the lateral directions and thus the adhesives in combination cover the post in the lateral directions. Alternatively, the first adhesive can contact the post and cover a lower portion of the post adjacent to the base in the lateral directions and the second adhesive can be spaced from the base and cover an upper portion of the post in the lateral directions. In this instance, neither adhesive covers the post in the lateral directions but the adhesives in combination cover the post in the lateral directions.

The adhesive interface can laterally surround the post. The adhesive interface can also be proximate to a corner of the heat spreader between the post and the base.

The post can be integral with the base. For instance, the post and the base can be a single-piece metal or include a single-piece metal at their interface, and the single-piece metal can be copper. The post can also extend through the aperture. The post can also be coplanar with the first adhesive below the dielectric layer at the base. The post can also have a cut-off conical shape in which its diameter decreases as it extends upwardly from the base to its flat top.

The base can cover the semiconductor device, the post, the substrate and the adhesives in the downward direction, support the substrate and extend to peripheral edges of the assembly.

The substrate can contact the adhesives and be spaced from the post and the base. The substrate can also be a laminated structure. The substrate can also include a single conductive layer or multiple conductive layers. For instance, the substrate can include a single conductive layer that contacts and extends above the dielectric layer. In this instance, the conductive layer includes the pad and the terminal. Thus, the substrate includes the terminal, the first adhesive is overlapped by the terminal and the signal routing between the pad and the terminal occurs above but not through the dielectric layer. Alternatively, the substrate can include a first conductive layer that contacts and extends above the dielectric layer, a second conductive layer that contacts and extends below the dielectric layer, and a via that extends through the dielectric layer and electrically connects the conductive layers. In this instance, the first conductive layer includes the pad. Furthermore, (1) the first conductive layer includes the terminal and the substrate includes another via that extends through the dielectric layer and electrically connects the conductive layers, in which case the substrate includes the terminal, the first adhesive is overlapped by the terminal and the signal routing between the pad and the terminal occurs through the dielectric layer but not the first adhesive, or alternatively, (2) the terminal is below the first adhesive and the substrate and the assembly includes another via that extends through the first adhesive and electrically connects the terminal and the second conductive layer, in which case the substrate excludes the terminal, the first adhesive overlaps the terminal and the signal routing between the pad and the terminal occurs through the dielectric layer and the first adhesive. In any case, the substrate includes the pad and provides some or all of the signal routing between the pad and the terminal.

The pad can be an electrical contact for the semiconductor device, the terminal can be an electrical contact for the next level assembly, and the pad and the terminal can provide signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting a first adhesive on the base including inserting the post into an opening in the first adhesive, mounting a conductive layer on the first adhesive including aligning the post with an aperture in the conductive layer, providing a conductive trace that includes a pad, a terminal and a selected portion of the conductive layer, then flowing a second adhesive into and downward in a gap between the post and the conductive trace, solidifying the second adhesive, then mounting a semiconductor device on a heat spreader that includes the post and the base, electrically connecting the semiconductor device to the conductive trace and thermally connecting the semiconductor device to the heat spreader.

In accordance with an aspect of the present invention, a method of making a semiconductor chip assembly includes (1) providing a post, a base, a conductive layer and a first adhesive, wherein (a) the post is adjacent to the base, extends above the base in an upward direction and extends through an opening in the first adhesive into an aperture in the conductive layer, (b) the base extends below the post in a downward direction opposite the upward direction and extends laterally from the post in lateral directions orthogonal to the upward and downward directions, (c) the first adhesive is mounted on and extends above the base and is sandwiched between the base and the conductive layer, and (d) the conductive layer is mounted on and extends above the first adhesive and is mechanically attached to the base by the first adhesive, (2) providing a conductive trace that includes a pad, a terminal and a selected portion of the conductive layer, (3) flowing a second adhesive into and downward in a gap that laterally surrounds and is adjacent to the post, thereby contacting the adhesives with one another, (4) solidifying the second adhesive, then (5) mounting a semiconductor device on a heat spreader that includes the post and the base, wherein the semiconductor device overlaps the post and the second adhesive overlaps the conductive trace and does not cover the post and the pad in the upward direction, (6) electrically connecting the semiconductor device to the pad, thereby electrically connecting the semiconductor device to the terminal, and (7) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing a first adhesive, wherein an opening extends through the first adhesive, (3) providing a conductive layer, wherein an aperture extends through the conductive layer, (4) mounting the first adhesive on the base, including inserting the post through the opening, wherein the first adhesive extends above the base and the post extends through the opening, (5) mounting the conductive layer on the base, including inserting the post into the aperture, wherein the conductive layer extends above and is mounted on the first adhesive and the first adhesive is sandwiched between the base and the conductive layer, then (6) applying pressure to the first adhesive, thereby deforming the first adhesive and attaching the base to the conductive layer, (7) providing a conductive trace that includes a pad and a terminal, wherein the conductive trace includes selected portions of the conductive layer and an electrically conductive path is between the pad and the terminal, (8) flowing a second adhesive into and downward in a gap that laterally surrounds and is adjacent to the post after applying pressure to the first adhesive, thereby contacting the adhesives with one another, (9) solidifying the second adhesive, then (10) mounting a semiconductor device on a heat spreader that includes the post and the base, wherein the semiconductor device overlaps the post and the second adhesive overlaps the conductive trace and does not cover the post and the pad in the upward direction, (11) electrically connecting the semiconductor device to the pad, thereby electrically connecting the semiconductor device to the terminal, and (12) thermally connecting the semiconductor device to the post, thereby thermally connecting the semiconductor device to the base.

Mounting the conductive layer can include mounting the conductive layer alone on the first adhesive, or alternatively, attaching the conductive layer to a carrier, then mounting the conductive layer and the carrier on the first adhesive such that the carrier overlaps the conductive layer and the conductive layer contacts the first adhesive and is sandwiched between the first adhesive and the carrier, and then, after applying pressure to the first adhesive, removing the carrier and then providing the conductive trace.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing a first adhesive, wherein an opening extends through the first adhesive, (3) providing a substrate that includes a conductive layer and a dielectric layer, wherein an aperture extends through the substrate, (4) mounting the first adhesive on the base, including inserting the post through the opening, wherein the first adhesive extends above the base and the post extends through the opening, (5) mounting the substrate on the base, including inserting the post into the aperture, wherein the substrate extends above the first adhesive, the conductive layer extends above the dielectric layer, the post extends through the opening into the aperture, the first adhesive is sandwiched between the base and the substrate and is solidified, and a gap is located in the aperture between the post and the substrate and the gap laterally surrounds and is adjacent to the post, then (6) moving the base and the substrate towards one another, thereby moving the post upward in the aperture and applying pressure to the first adhesive between the base and the substrate, wherein the pressure forces the first adhesive to deform and attach the base to the substrate, then (7) providing a conductive trace that includes a pad and a terminal, wherein the pad includes selected portions of the conductive layer and an electrically conductive path is between the pad and the terminal, then (8) flowing the second adhesive into and downward in the gap, thereby contacting the adhesives with one another, then (9) applying heat to solidify the second adhesive, then (10) mounting a semiconductor device on a heat spreader that includes the post and the base, wherein the semiconductor device overlaps the post and the second adhesive overlaps the routing line and does not cover the post and the pad in the upward direction, (11) electrically connecting the semiconductor device to the pad, thereby electrically connecting the semiconductor device to the terminal, and (12) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing a first adhesive, wherein an opening extends through the first adhesive, (3) providing a substrate that includes a conductive layer and a dielectric layer, wherein an aperture extends through the substrate, (4) mounting the first adhesive on the base, including inserting the post through the opening, wherein the first adhesive extends above the base and the post extends through the opening, (5) mounting the substrate on the base, including inserting the post into the aperture, wherein the substrate extends above the first adhesive, the conductive layer extends above the dielectric layer, the post extends through the opening into the aperture, the first adhesive is sandwiched between the base and the substrate and is solidified, and a gap is located in the aperture between the post and the substrate and the gap laterally surrounds and is adjacent to the post, then (6) moving the base and the substrate towards one another, thereby moving the post upward in the aperture and applying pressure to the first adhesive between the base and the substrate, wherein the pressure forces the first adhesive to deform and attach the base to the substrate, then (7) providing a conductive trace that includes a pad, a terminal and a routing line, wherein the pad, the terminal and the routing line include selected portions of the conductive layer and an electrically conductive path between the pad and the terminal includes the routing line, then (8) flowing the second adhesive into and downward in the gap, thereby contacting the adhesives with one another, then (9) applying heat to solidify the second adhesive, then (10) mounting a semiconductor device on a heat spreader that includes the post and the base, wherein the semiconductor device overlaps the post and the second adhesive overlaps the routing line and does not cover the post and the pad in the upward direction, (11) electrically connecting the semiconductor device to the pad, thereby electrically connecting the semiconductor device to the terminal, and (12) thermally connecting the semiconductor device to the post, thereby thermally connecting the semiconductor device to the base.

Providing the post and the base can include providing a metal plate, forming an etch mask on the metal plate that selectively exposes the metal plate, etching the metal plate in a pattern defined by the etch mask, thereby forming a recess in the metal plate that extends into but not through the metal plate, and then removing the etch mask, wherein the post is an unetched portion of the metal plate that protrudes above the base and is laterally surrounded by the recess, and the base is an unetched portion of the metal plate below the post and the recess.

Providing the first adhesive can include providing a pressure-sensitive adhesive tape, flowing the second adhesive can include depositing a liquid resin over the conductive trace and into the gap, and solidifying the second adhesive can include solidifying the liquid resin. Flowing the second adhesive can also include filling the gap with the second adhesive, and solidifying the second adhesive can include mechanically bonding the post to the substrate as well as solidifying a solder mask for the conductive trace that selectively exposes the post, the pad and the terminal.

Providing the heat spreader can include providing a cap on the post that is above and adjacent to and covers in the upward direction and extends laterally in the lateral directions from a top of the post after solidifying the second adhesive.

Providing the pad can include removing selected portions of the conductive layer after providing the first adhesive and before solidifying the second adhesive.

Providing the pad can also include grinding the post, the conductive layer and the second adhesive after solidifying the second adhesive such that the post, the conductive layer and the second adhesive are laterally aligned with one another at a top lateral surface that faces in the upward direction, and then removing selected portions of the conductive layer such that the pad includes selected portions of the conductive layer. The grinding can include grinding the second adhesive without grinding the post and then grinding the post, the conductive layer and the second adhesive. The removing can include applying a wet chemical etch to the conductive layer using an etch mask that defines the pad.

Providing the pad can also include depositing a second conductive layer on the post, the conductive layer and the second adhesive after the grinding and then removing selected portions of the conductive layers such that the pad includes selected portions of the conductive layers. Depositing the second conductive layer can include electrolessly plating a first plated layer on the post, the conductive layer and the second adhesive and then electroplating a second plated layer on the first plated layer. The removing can include applying the wet chemical etch to the conductive layers using the etch mask to define the pad.

Providing the terminal can include removing selected portions of the conductive layer after providing the first adhesive and before solidifying the second adhesive. Providing the terminal can also include the grinding and then removing selected portions of the conductive layer using the etch mask to define the terminal such that the terminal includes selected portions of the conductive layer. Providing the terminal can also include the grinding and then removing selected portions the conductive layers using the etch mask to define the terminal such that the terminal includes selected portions of the conductive layers. Thus, the pad and the terminal can be formed simultaneously using the same grinding, wet chemical etch and etch mask.

Providing the cap can include removing selected portions of the second conductive layer. Providing the cap can also include the grinding and then removing selected portions of the second conductive layer using the etch mask to define the cap such that the cap includes selected portions of the second conductive layer. Thus, the pad and the cap can be formed simultaneously using the same grinding, wet chemical etch and etch mask. Likewise, the pad, the terminal and the cap can be formed simultaneously using the same grinding, wet chemical etch and etch mask.

Mounting the conductive layer can include mounting the conductive layer on the first adhesive and then mounting the conductive layer and the first adhesive on the base. Likewise, mounting the conductive layer can include mounting the conductive layer and the dielectric layer on the first adhesive and then mounting the conductive layer, the dielectric layer and the first adhesive on the base. Furthermore, providing the substrate and the first adhesive can include attaching the conductive layer to the dielectric layer, then attaching the first adhesive to the dielectric layer, then forming the opening and the aperture and then mounting the conductive layer, the dielectric layer and the first adhesive on the base.

Mounting the semiconductor device can include mounting the semiconductor device on the post. Mounting the semiconductor device can also include positioning the semiconductor device above and overlapping the post, the opening and the aperture.

Mounting the semiconductor device can include providing a first solder joint between an
LED package that includes an LED chip and the pad and a second solder joint between the LED package and the post, electrically connecting the semiconductor device can include providing the first solder joint between the LED package and the pad, and thermally connecting the semiconductor device can include providing the second solder joint between the LED package and the post.

Mounting the semiconductor device can include providing a die attach between a semiconductor chip and the post, electrically connecting the semiconductor device can include providing a wire bond between the chip and the pad, and thermally connecting the semiconductor device can include providing the die attach between the chip and the post.

The first adhesive can be a pressure-sensitive adhesive tape before mounting it on the base and then a pressure-insensitive adhesive tape after mounting the it on the base and applying pressure to it. In other words, the pressure forces the first adhesive to attach the base to the substrate and renders it pressure-insensitive. The first adhesive can also contact the base and the dielectric layer, cover the substrate in the downward direction, surround the post in the lateral directions and extend to peripheral edges of the assembly after the assembly is manufactured and detached from other assemblies in a batch.

The second adhesive can be a solder mask that selectively exposes the post and the pad after solidifying the second adhesive and before mounting the semiconductor device on the post. The second adhesive can also contact the post and the dielectric layer, cover the routing line in the upward direction, surround the post in the lateral directions and extend to peripheral edges of the assembly after the assembly is manufactured and detached from other assemblies in a batch.

The base can cover the semiconductor device, the post, the substrate and the adhesives in the downward direction, support the substrate and extend to peripheral edges of the assembly after the assembly is manufactured and detached from other assemblies in a batch.

The present invention has numerous advantages. The heat spreader can provide excellent heat spreading and heat dissipation without heat flow through the adhesives. As a result, the adhesives can be low cost dielectrics with low thermal conductivity and not prone to delamination. The post and the base can be integral with one another, thereby enhancing reliability. The post can be customized for the semiconductor device, thereby enhancing the thermal connection. The first adhesive can be sandwiched between the base and the substrate, thereby providing a robust mechanical bond between the heat spreader and the substrate. The substrate can provide single-layer signal routing with simple circuitry patterns or flexible multi-layer signal routing with complex circuitry patterns. The conductive trace can provide horizontal signal routing between the pad and the terminal above the dielectric layer or vertical signal routing between the pad above the dielectric layer and the terminal below the first adhesive. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 3A-3I are cross-sectional views showing a method of making a thermal board with horizontal signal routing in accordance with an embodiment of the present invention;

DETAILED DESCRIPTION OF THE INVENTION

Figure 1A:
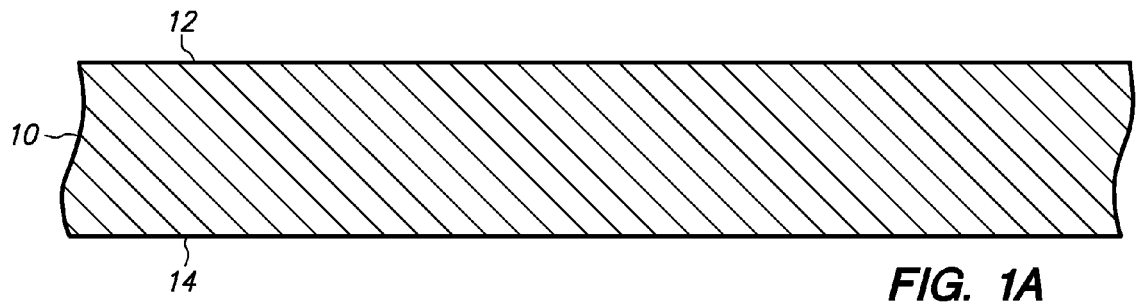
FIGS. 1A-1D are cross-sectional views showing a method of making a post and a base in accordance with an embodiment of the present invention.
Figure 1B:
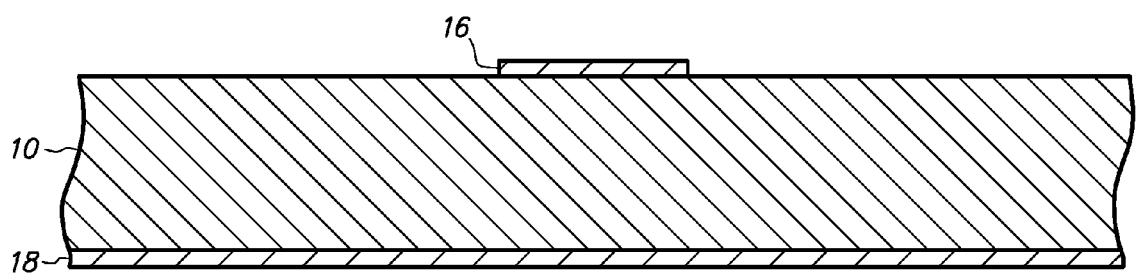
Figure 1C:
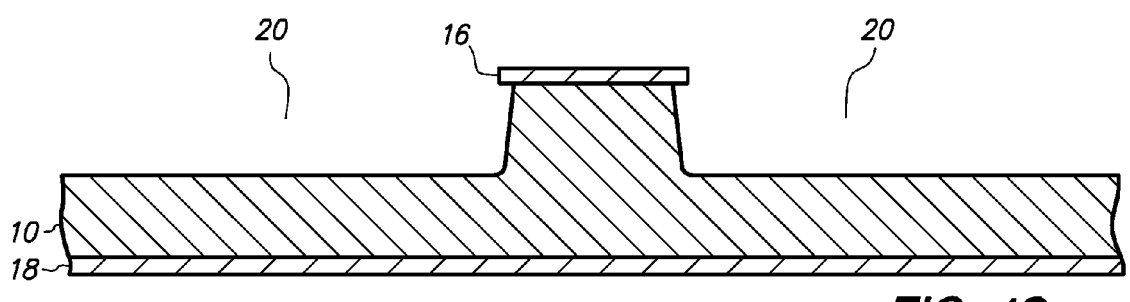
Figure 1D:
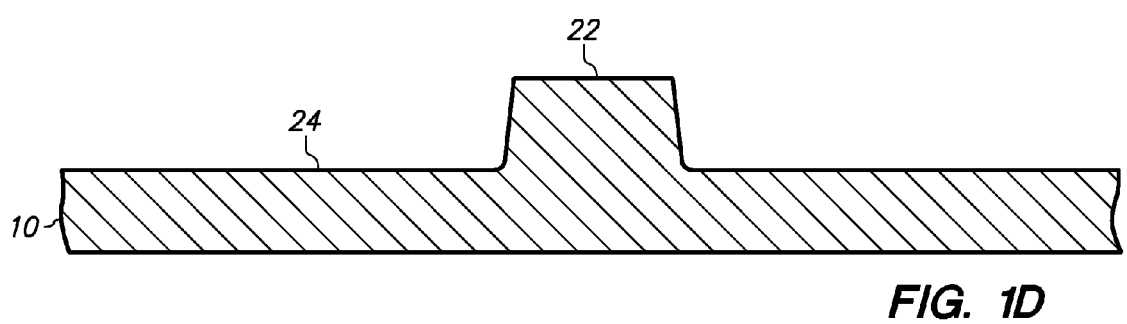
Figure 1E:
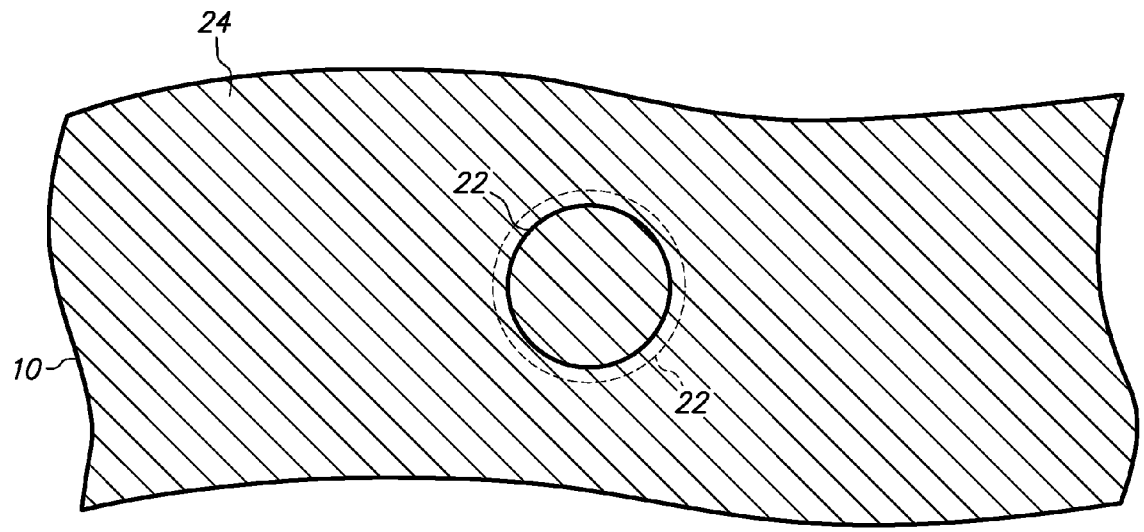
FIGS. 1E and 1F are top and bottom views, respectively, corresponding to FIG. 1D.
Figure 1F:
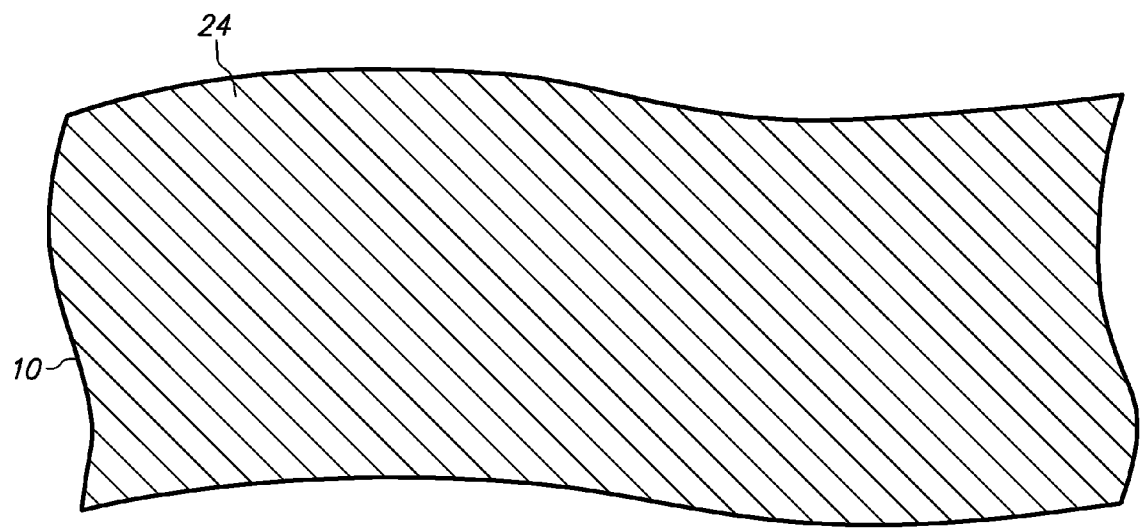

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 500 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of copper and etches 150 microns into metal plate 10. As a result, recess 20 extends from surface 12 into but not through metal plate 10, is spaced from surface 14 by 350 microns and has a depth of 150 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes post 22 and base 24.

Post 22 is an unetched portion of metal plate 10 defined by etch mask 16. Post 22 is adjacent to and integral with and protrudes above base 24 and is laterally surrounded by recess 20. Post 22 has a height of 150 microns (recess 20 depth), a diameter at its top surface (circular portion of surface 12) of 1000 microns and a diameter at its bottom (circular portion adjacent to base 24) of 1100 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of metal plate 10 that is below post 22, extends laterally from post 22 in a lateral plane (with lateral directions such as left and right) and has a thickness of 350 microns (500-150).

Post 22 and base 24 can be treated to improve bondability to epoxy and solder. For instance, post 22 and base 24 can be chemically oxidized or microetched to provide rougher surfaces.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing an upper portion of post 22 on an etch-defined lower portion of post 22. Post 22 and base 24 can also be formed semi-additively by depositing a conformal upper portion of post 22 and base 24 on an etch-defined lower portion of post 22 and base 24. Post 22 can also be sintered to base 24.

Figure 2A:
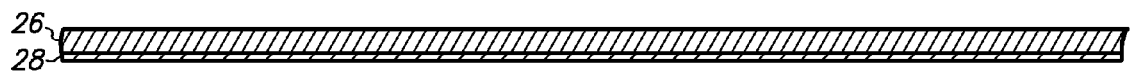
FIGS. 2A-2E are cross-sectional views showing a method of making an adhesive tape and a substrate in accordance with an embodiment of the present invention.
Figure 2B:
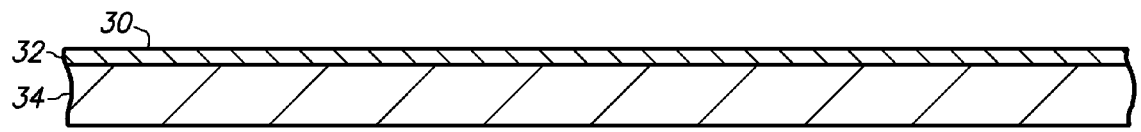
Figure 2C:
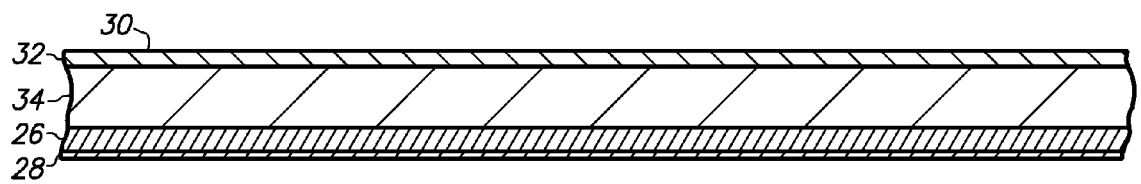
Figure 2D:
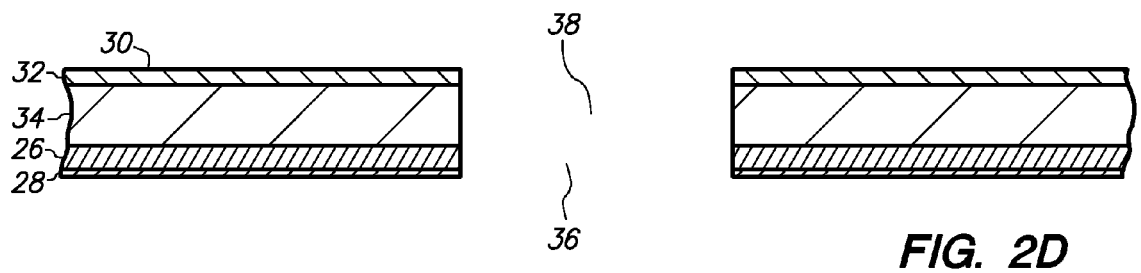
Figure 2E:
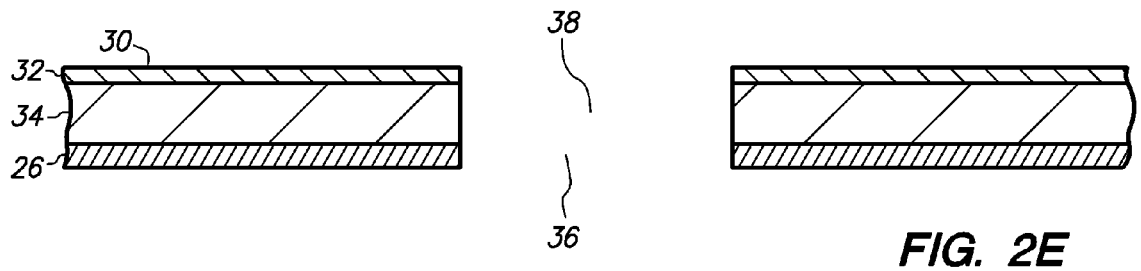
Figure 2F:
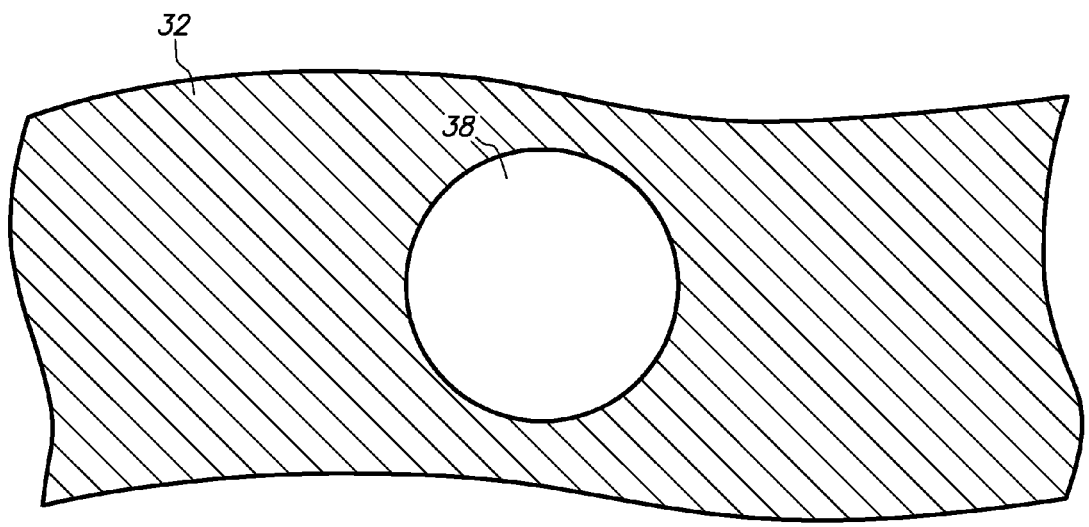
FIGS. 2F and 2G are top and bottom views, respectively, corresponding to FIG. 2E.
Figure 2G:
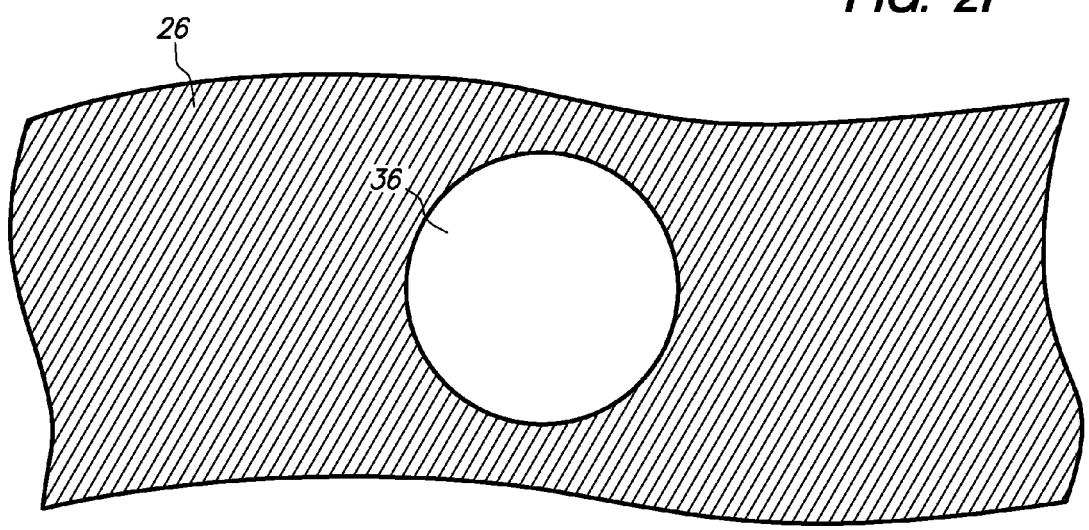

FIGS. 2A-2E are cross-sectional views showing a method of making an adhesive tape and a substrate in accordance with an embodiment of the present invention, and FIGS. 2F and 2G are top and bottom views, respectively, corresponding to FIG. 2E.

FIG. 2A is a cross-sectional view of adhesive tape 26 and release liner 28. Adhesive tape 26 (the first adhesive) is illustrated as a thermally conductive, electrically insulative, pressure-sensitive adhesive tape provided as a solidified unpatterned sheet with a thickness of 30 microns. Release liner 28 is illustrated as a protective paper liner that covers the backside of adhesive tape 26. Release liner 28 protects adhesive tape 26 from debris and prevents premature adhesive contact. Commercially available adhesive tapes with release liners such as Bond-Ply® 450 by The Bergquist Company of Chanhassen, Minn. are suitable.

FIG. 2B is a cross-sectional view of substrate 30 that includes conductive layer 32 and dielectric layer 34. Conductive layer 32 is an electrical conductor that contacts and extends above dielectric layer 34, and dielectric layer 34 is an electrical insulator. For instance, conductive layer 32 is an unpatterned copper sheet with a thickness of 30 microns, and dielectric layer 34 is an unpatterned epoxy sheet with a thickness of 100 microns.

Substrate 30 is illustrated as a laminated structure. Substrate 30 can be other electrical interconnects such as a ceramic board or a printed circuit board. Likewise, substrate 30 can include additional layers of embedded circuitry.

FIG. 2C is a cross-sectional view of substrate 30 mounted on adhesive tape 26. In this structure, conductive layer 32 provides the top surface, release liner 28 provides the bottom surface, adhesive tape 26 contacts and is sandwiched between release liner 28 and dielectric layer 34, and dielectric layer 34 contacts and is sandwiched between adhesive tape 26 and conductive layer 32. Furthermore, substrate 30 is securely fastened to adhesive tape 26.

FIG. 2D is a cross-sectional views of adhesive tape 26 with opening 36 and substrate 30 with aperture 38. Opening 36 is a central window that extends through adhesive tape 26 and release liner 28. Aperture 38 is a central window that extends through conductive layer 32 and dielectric layer 34. Opening 36 and aperture 38 are formed by mechanical drilling through adhesive tape 26, release liner 28, conductive layer 32 and dielectric layer 34, are aligned with one another and have a diameter of 1150 microns. Thus, opening 36 and aperture 38 in combination form a through-hole in the structure. Opening 36 and aperture 38 can be formed with other techniques such as punching and stamping. Preferably, opening 36 and aperture 38 have the same diameter and are formed in the same manner with the same drill bit at the same drilling station.

FIGS. 2E, 2F and 2G are cross-sectional, top and bottom views, respectively, of adhesive tape 26 and substrate 30 after release liner 28 is removed. Release liner 28 is manually peeled-off adhesive tape 26. At this stage, adhesive tape 26 provides the bottom surface.

Figure 3A:
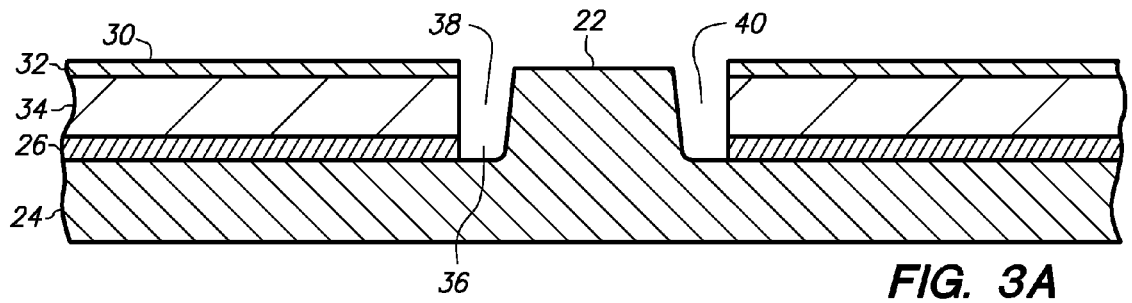
Figure 3B:
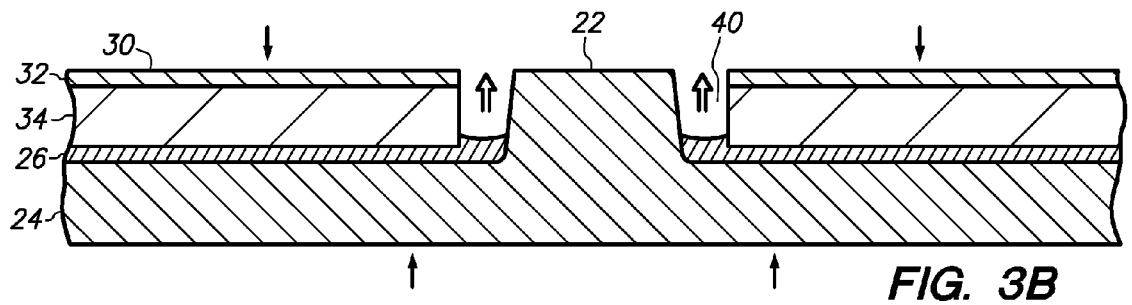
Figure 3C:
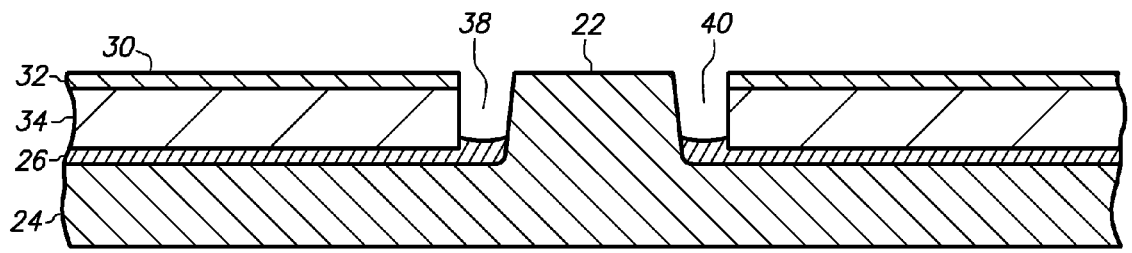
Figure 3D:
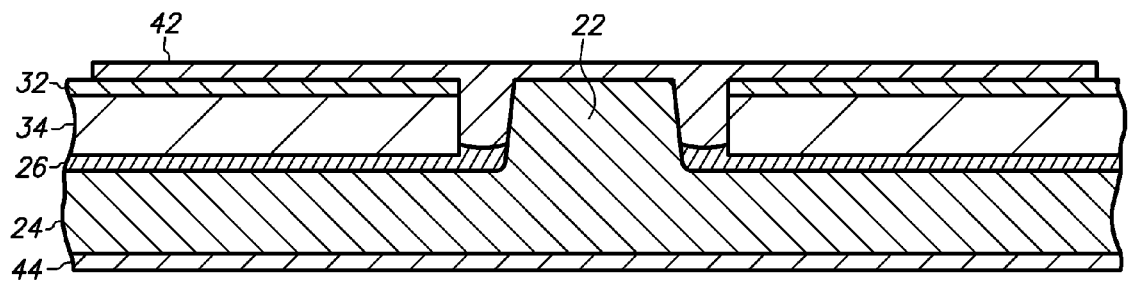
Figure 3E:
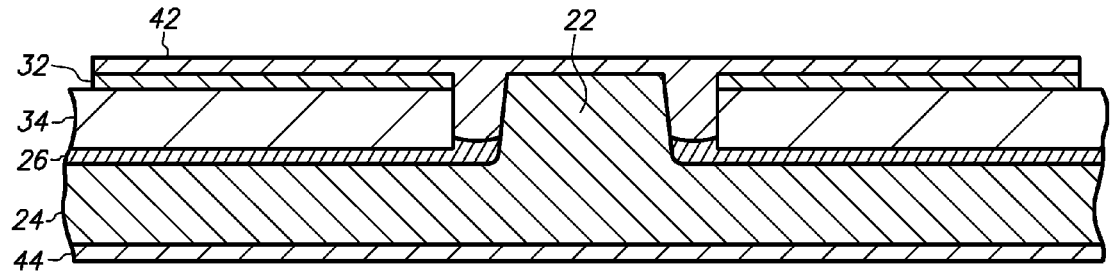
Figure 3F:
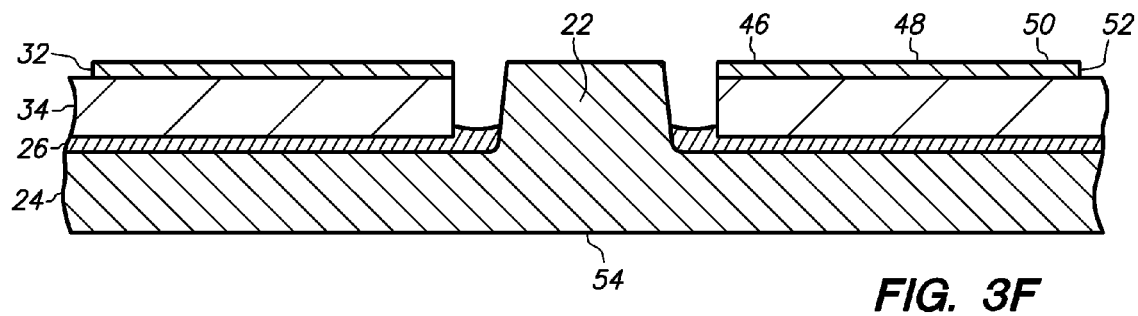
Figure 3G:
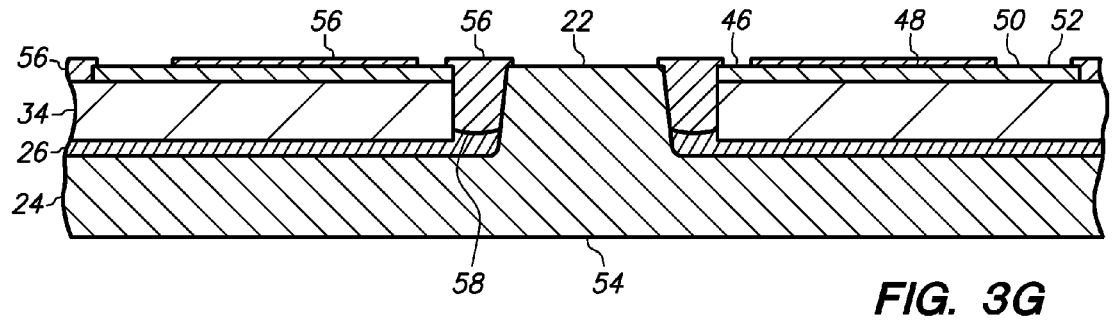
Figure 3H:
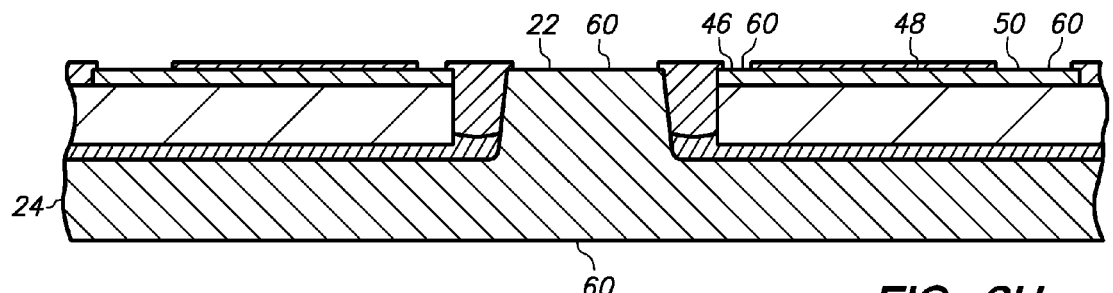
Figure 31:
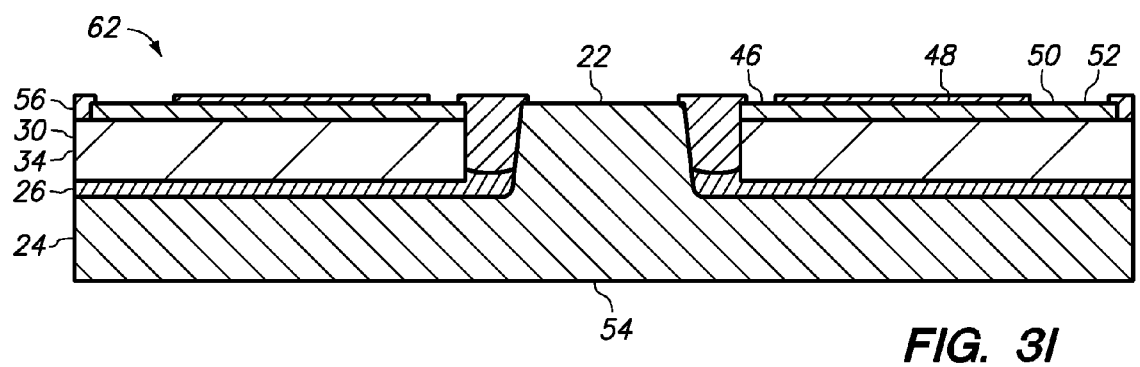
Figure 3J:
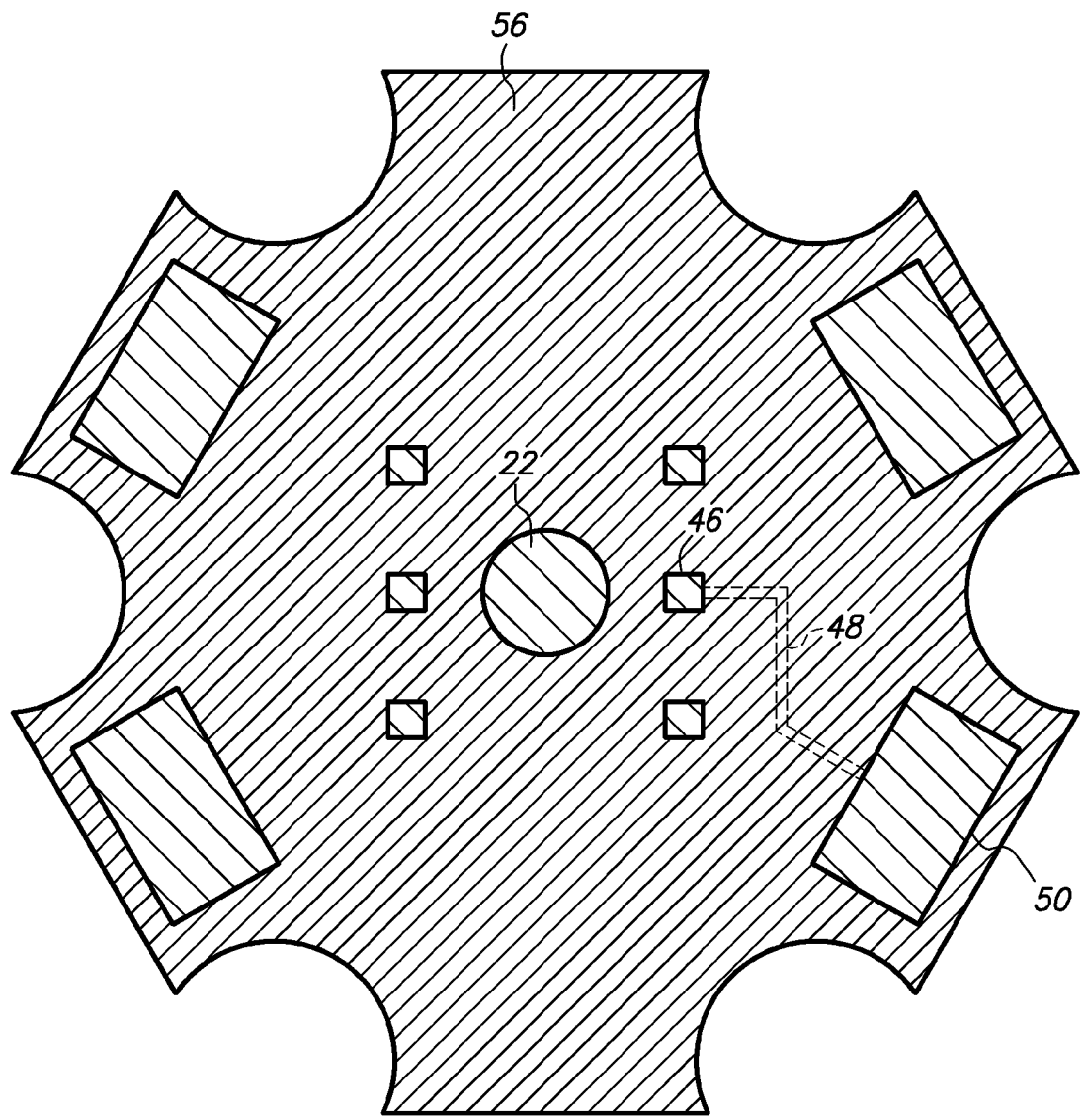
FIGS. 3J and 3K are top and bottom views, respectively, corresponding to FIG. 3I.
Figure 3K:
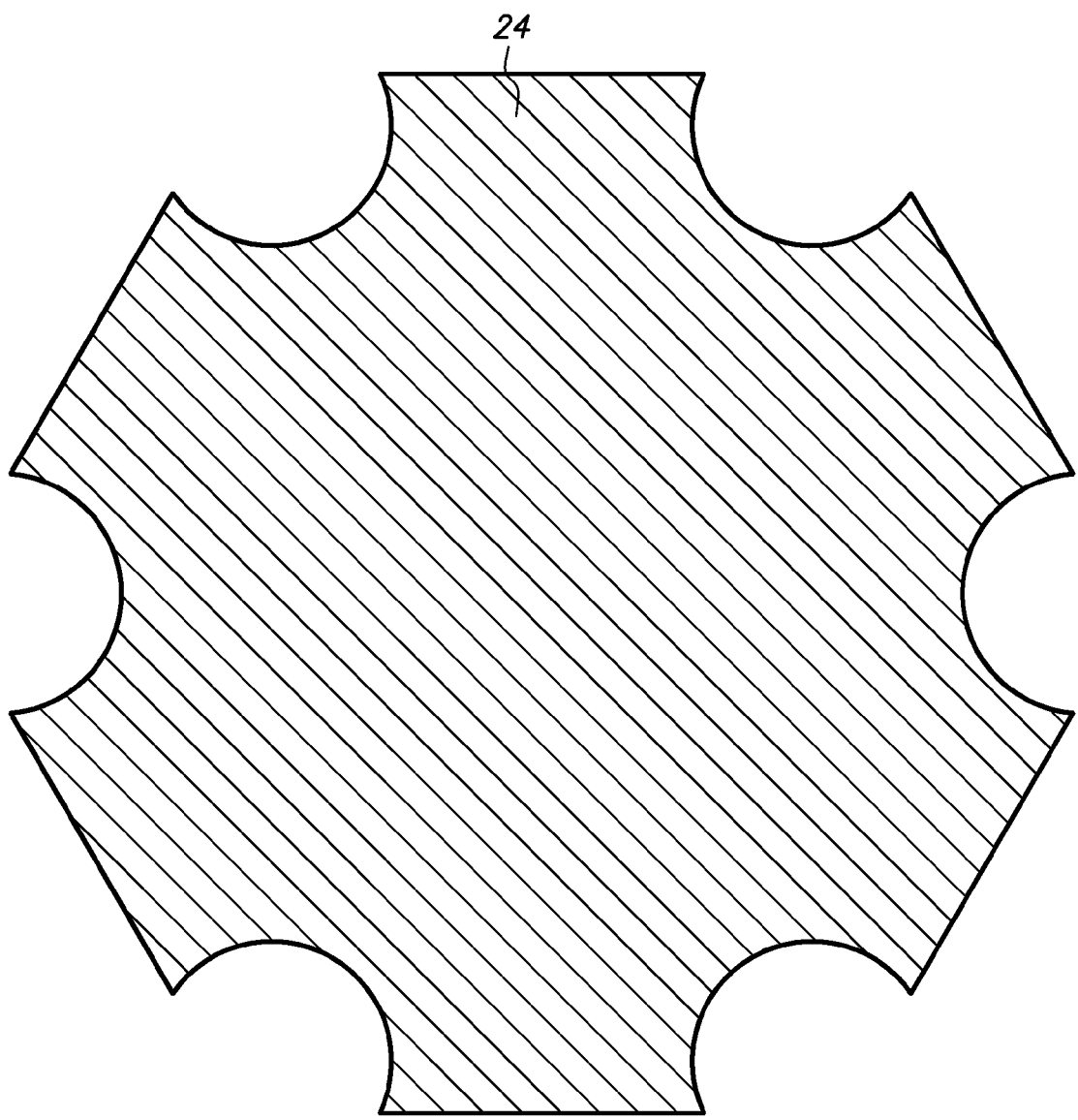

FIGS. 3A-3I are cross-sectional views showing a method of making a thermal board with horizontal signal routing that includes post 22, base 24, adhesive tape 26 and substrate 30 in accordance with an embodiment of the present invention, and FIGS. 3J and 3K are top and bottom views, respectively, corresponding to FIG. 3I.

FIG. 3A is a cross-sectional view of the structure with adhesive tape 26 and substrate 30 mounted on base 24. Adhesive tape 26 and substrate 30 are mounted by lowering adhesive tape 26 onto base 24 as post 22 is inserted into and through and upward in opening 36 and then into and upward in aperture 38. Adhesive tape 26 eventually contacts and rests on base 24, and substrate 30 remains spaced from base 24. Preferably, post 22 is inserted into and extends through opening 36 without contacting adhesive tape 26 and is aligned with and centrally located within opening 36, and post 22 is inserted into but not through aperture 38 without contacting substrate 30 and is aligned with and centrally located within aperture 38. As a result, gap 40 is located in aperture 38 between post 22 and substrate 30. Gap 40 laterally surrounds post 22 and is laterally surrounded by substrate 30. In addition, opening 36 and aperture 38 remain precisely aligned with one another and have the same diameter.

At this stage, substrate 30 is mounted on and extends above base 24 and adhesive tape 26, contacts adhesive tape 26 and is spaced from base 24. Post 22 extends through opening 36 into aperture 38, is 10 microns below the top surface of conductive layer 32 and is exposed through aperture 38 in the upward direction. Adhesive tape 26 contacts and is sandwiched between base 24 and dielectric layer 34 but is spaced from conductive layer 32 and remains a pressure-sensitive adhesive tape, and gap 40 is filled with air. Furthermore, adhesive tape 26 may weakly adhere to base 24 but is not securely fastened to base 24, and therefore base 24 is not attached to substrate 30.

FIG. 3B is a cross-sectional view of the structure with adhesive tape 26 compressed by applying pressure. In this illustration, adhesive tape 26 is compressed by applying downward pressure to conductive layer 32 and/or upward pressure to base 24, thereby moving base 24 and substrate 30 towards one another and applying pressure to adhesive tape 26 while simultaneously applying heat to adhesive tape 26. As a result, adhesive tape 26 sandwiched between base 24 and substrate 30 is compressed, deformed and forced out of its original shape to contact post 22 and extend slightly into and upward in gap 40. However, adhesive tape 26 exhibits no appreciable flow and essentially retains its original shape. Moreover, adhesive tape 26 remains sandwiched between and continues to fill the reduced space between base 24 and substrate 30, and gap 40 remains almost entirely filled with air.

For instance, base 24 and conductive layer 32 can be disposed between top and bottom platens (not shown) of a press. In addition, a top cull plate and top buffer paper (not shown) can be sandwiched between conductive layer 32 and the top platen, and a bottom cull plate and bottom buffer paper (not shown) can be sandwiched between base 24 and the bottom platen. The stack includes the top platen, top cull plate, top buffer paper, substrate 30, adhesive tape 26, base 24, bottom buffer paper, bottom cull plate and bottom platen in descending order. Furthermore, the stack may be positioned on the bottom platen by tooling pins (not shown) that extend upward from the bottom platen through registration holes (not shown) in base 24.

The platens are heated and move towards one another, thereby applying heat and pressure to adhesive tape 26. The cull plates disperse the heat from the platens so that it is more uniformly applied to base 24 and substrate 30 and thus adhesive tape 26, and the buffer papers disperse the pressure from the platens so that it is more uniformly applied to base 24 and substrate 30 and thus adhesive tape 26. Initially, dielectric layer 34 presses down on adhesive tape 26. As the platen motion and heat continue, adhesive tape 26 between base 24 and substrate 30 is compressed and squeezed by the pressure into gap 40.

The upward flow of adhesive tape 26 in gap 40 is shown by the thick upward arrows, the upward motion of post 22 and base 24 relative to substrate 30 is shown by the thin upward arrows, and the downward motion of substrate 30 relative to post 22 and base 24 is shown by the thin downward arrows.

The platen motion is eventually blocked by adhesive tape 26 becoming non-compliant and the platens become stationary. Thereafter, the platens move away from one another and the structure is released from the press.

FIG. 3C is a cross-sectional view of the structure with base 24 attached to substrate 30 by adhesive tape 26.

Adhesive tape 26 as compressed provides a secure robust mechanical bond between base 24 and substrate 30. Furthermore, adhesive tape 26 is rendered pressure-insensitive and securely fastened to base 24 by the pressure. Adhesive tape 26 can withstand normal operating pressure without distortion or damage and is only temporarily distorted under unusually high pressure. Furthermore, adhesive tape 26 can absorb thermal expansion mismatch between base 24 and substrate 30.

At this stage, post 22 and conductive layer 32 are essentially coplanar with one another. For instance, adhesive tape 26 between base 24 and dielectric layer 34 has a thickness of 25 microns which is 5 microns less than its initial thickness of 30 microns, post 22 ascends 5 microns in aperture 38 and substrate 30 descends 5 microns relative to post 22. As a result, post 22 extends through opening 36 into aperture 38, is 5 microns below the top surface of conductive layer 32 and is exposed through aperture 38 in the upward direction. The 150 micron height of post 22 is essentially the same as the combined height of conductive layer 32 (30 microns), dielectric layer 34 (100 microns) and the underlying adhesive tape 26 (25 microns). Furthermore, post 22 continues to be centrally located in opening 36 and aperture 38 and spaced from substrate 30, adhesive tape 26 fills the space between base 24 and substrate 30, and gap 40 is almost entirely filled with air. For instance, gap 40 has a width of 75 microns ((1150−1000)/2) at the top surface of post 22.

FIG. 3D is a cross-sectional view of the structure with etch mask 42 and cover mask 44 formed on the top and bottom surfaces, respectively, of the structure. Etch mask 42 and cover mask 44 are illustrated as photoresist layers similar to photoresist layers 16 and 18, respectively. Photoresist layer 42 has a pattern that selectively exposes conductive layer 32, and photoresist layer 44 remains unpatterned and covers base 24.

FIG. 3E is a cross-sectional view of the structure with selected portions of conductive layer 32 removed by etching conductive layer 32 in the pattern defined by etch mask 42. The etching is a front-side wet chemical etch similar to the etch applied to metal plate 10. The wet chemical etch etches through conductive layer 32 to expose dielectric layer 34 and converts conductive layer 32 from an unpatterned into a patterned layer, post 22 is not affected and base 24 remains unpatterned.

FIG. 3F is a cross-sectional view of the structure after etch mask 42 and cover mask 44 are removed. Photoresist layers 42 and 44 can be stripped in the same manner as photoresist layers 16 and 18.

Conductive layer 32 as etched includes pad 46, routing line 48 and terminal 50. Pad 46, routing line 48 and terminal 50 are unetched portions of conductive layer 32 defined by etch mask 42. Thus, conductive layer 32 is a patterned layer that includes pad 46, routing line 48 and terminal 50 and excludes post 22 and base 24. Furthermore, routing line 48 is a copper trace that contacts and extends above dielectric layer 34 and is adjacent to and electrically connects pad 46 and terminal 50.

Conductive trace 52 is provided by pad 46, routing line 48 and terminal 50. Similarly, an electrically conductive path between pad 46 and terminal 50 is routing line 48. Conductive trace 52 provides horizontal (lateral) fan-out routing from pad 46 to terminal 50. Conductive trace 52 is not be limited to this configuration. For instance, the electrically conductive path can include vias that extend through dielectric layer 34 and additional routing lines (above and/or below dielectric layer 34) as well as passive components such as resistors and capacitors mounted on additional pads.

Heat spreader 54 includes post 22 and base 24. Heat spreader 54 is essentially a heat slug with an inverted T-like shape that includes a pedestal (post 22) and wings (base 24 portions that extend laterally from the pedestal).

FIG. 3G is a cross-sectional view of the structure with solder mask 56 formed on post 22, adhesive tape 26, dielectric layer 34 and conductive trace 52.

Solder mask 56 (the second adhesive) is an electrically insulative layer that is deposited into gap 40 and over conductive trace 52 and then selectively patterned to expose post 22, pad 46 and terminal 50 and cover routing line 48 and the exposed portions of dielectric layer 34 in the upward direction. Solder mask 56 fills the remaining space in gap 40 and overlaps conductive trace 52. Solder mask 56 also contacts adhesive tape 26 at adhesive interface 58 in gap 40, contacts post 22 and dielectric layer 34 in gap 40, contacts dielectric layer 34 and conductive trace 52 outside gap 40 and is spaced from base 24. Solder mask 56 provides a secure robust mechanical bond between post 22 and substrate 30 and can absorb thermal expansion mismatch between post 22 and substrate 30. Solder mask 56 has a thickness of 25 microns above post 22, pad 46 and terminal 50 and extends 55 microns (30+25) above dielectric layer 34.

Solder mask 56 can initially be a photoimageable liquid resin that is dispensed on the structure, covers conductive trace 32 in the upward direction and flows into gap 40. Thereafter, solder mask 56 is patterned by selectively applying light through a reticle (not shown) so that the solder mask portions exposed to the light are rendered insoluble, applying a developer solution to remove the solder mask portions that are unexposed to the light and remain soluble and then hard baking to solidify the solder mask portions, as is conventional.

Solder mask 56 can also initially be an A-stage liquid epoxy resin such as FR-4 that is dispensed on the structure, covers conductive trace 32 in the upward direction and flows into gap 40. Thereafter, the liquid epoxy resin is cured by applying heat to form a C-stage solidified epoxy and then the solidified epoxy is patterned by selective laser ablation or plasma etching, as is conventional.

In any case, solder mask 56 is deposited into gap 40 as a liquid resin that is compliant enough at room temperature to conform to virtually any shape, extends inside and outside gap 40 and fills nearly all of gap 40. Thereafter, solder mask 56 is solidified and patterned to selectively expose post 22, pad 46 and terminal 50.

At this stage, adhesive tape 26 surrounds a lower portion of post 22 in the lateral directions, solder mask 56 surrounds an upper portion of post 22 in the lateral directions, and adhesive tape 26 and solder mask 56 in combination cover post 22 in the lateral directions. Likewise, adhesive interface 58 surrounds post 22 in the lateral directions proximate to a corner of heat spreader 54 between post 22 and base 24. Furthermore, adhesive tape 26 and solder mask 56 in combination have an I-like shape with a lower horizontal line (adhesive tape 26), an upper horizontal line (solder mask 56) and a vertical line (solder mask 56).

FIG. 3H is a cross-sectional view of the structure with plated contacts 60 formed on post 22, base 24, pad 46 and terminal 50.

Plated contacts 60 are thin spot plated metal coatings that contact post 22, pad 46 and terminal 50 and cover their exposed portions in the upward direction and contact base 24 and cover it in the downward direction. For instance, a nickel layer is electrolessly plated on post 22, base 24, pad 46 and terminal 50, and then a gold layer is electrolessly plated on the nickel layer. The buried nickel layer has a thickness of 3 microns, the gold surface layer has a thickness of 0.5 microns, and plated contacts 60 have a thickness of 3.5 microns.

Post 22, base 24, pad 46 and terminal 50 treated with plated contacts 60 as a surface finish have several advantages. The buried nickel layer provides the primary mechanical and electrical and/or thermal connection, and the silver surface layer provides a wettable surface to facilitate solder reflow. Plated contacts 60 also protect post 22, base 24, pad 46 and terminal 50 from corrosion. Plated contacts 60 can include a wide variety of metals to accommodate the external connection media. For instance, a silver surface layer plated on a buried nickel layer can accommodate a solder joint or a wire bond.

Post 22, base 24, pad 46 and terminal 50 treated with plated contacts 60 are shown as single layers for convenience of illustration. The boundary (not shown) with plated contacts 60 in post 22, base 24, pad 46 and terminal 50 occurs at the copper/nickel interface.

FIGS. 3I, 3J and 3K are cross-sectional, top and bottom views, respectively, of thermal board 62 after it is detached at peripheral edges along cut lines from a support frame and/or adjacent thermal boards in a batch.

Thermal board 62 includes adhesive tape 26, substrate 30, heat spreader 54 and solder mask 56. Substrate 30 includes dielectric layer 34 and conductive trace 52 which includes pad 46, routing line 48 and terminal 50. Heat spreader 54 includes post 22 and base 24.

Post 22 extends through opening 36 and into aperture 38 and remains centrally located within opening 36 and aperture 38. Post 22 retains its cut-off conical shape with tapered sidewalls in which its diameter decreases as it extends upwardly from base 24 to its flat circular top surface. Post 22 is also nearly coplanar with pad 46 and terminal 50 above dielectric layer 34 and is coplanar with adhesive tape 26 below dielectric layer 34 at base 24. Base 24 covers post 22, adhesive tape 26, substrate 30, conductive trace 52 and solder mask 56 in the downward direction and extends to the peripheral edges of thermal board 62.

Adhesive tape 26 is mounted on and extends above base 24, contacts and is sandwiched between and fills the space between base 24 and dielectric layer 34 outside gap 40, extends laterally from post 22 beyond and is overlapped by terminal 50, covers base 24 outside the periphery of post 22 in the upward direction, covers substrate 30 in the downward direction, surrounds post 22 in the lateral directions, is contained in the space between substrate 30 and heat spreader 54 and is solidified.

Substrate 30 is mounted on and contacts adhesive tape 26, extends above the underlying adhesive tape 26 and extends above base 24, conductive trace 52 (as well as pad 46, routing line 48 and terminal 50) contacts and extends above dielectric layer 34, and dielectric layer 34 contacts and is sandwiched between adhesive tape 26 and conductive trace 52.

Solder mask 56 is mounted on and extends above base 24, contacts and is sandwiched between and fills nearly all the space between post 22 and dielectric layer 34 in gap 40, contacts dielectric layer 34 and conductive trace 52 outside gap 40, extends laterally from post 22 beyond terminal 50, overlaps dielectric layer 34 and conductive trace 52 and surrounds post 22 in the lateral directions.

Post 22 and base 24 remain spaced from substrate 30. As a result, substrate 30 and heat spreader 54 are mechanically attached and electrically isolated from one another.

Base 24, adhesive tape 26, dielectric layer 34 and solder mask 56 extend to straight vertical peripheral edges of thermal board 62 after it is detached or singulated from a batch of identical simultaneously manufactured thermal boards.

Pad 46 is customized as an electrical interface for a semiconductor device such as an LED chip that is subsequently mounted on post 22, terminal 50 is customized as an electrical interface for the next level assembly such as a solderable wire from a printed circuit board, and base 24 is customized as a thermal interface for the next level assembly such as a heat sink for an electronic device. Furthermore, post 22 is thermally connected to base 24.

Pad 46 and terminal 50 are laterally offset from one another and exposed at the top surface of thermal board 62, thereby providing horizontal fan-out routing between the semiconductor device and the next level assembly. Pad 46 and terminal 50 are also coplanar with one another at their top surfaces above dielectric layer 34.

Conductive trace 52 is shown in cross-section as a continuous circuit trace for convenience of illustration. However, conductive trace 52 typically provides horizontal signal routing in both the X and Y directions. That is, pad 46 and terminal 50 are laterally offset from one another in the X and Y directions, and routing line 48 routes in the X and Y directions.

Heat spreader 54 provides heat spreading and heat dissipation from a semiconductor device that is subsequently mounted on post 22 to the next level assembly that thermal board 62 is subsequently mounted on. The semiconductor device generates heat that flows into post 22 and through post 22 into base 24 where it is spread out and dissipated in the downward direction, for instance to an underlying heat sink.

Thermal board 62 does not expose routing line 48. Routing line 48 is covered by solder mask 56 and is shown in phantom in FIG. 3J for convenience of illustration.

Thermal board 62 includes multiple conductive traces 52 that typically include pad 46, routing line 48 and terminal 50. A single conductive trace 52 is described and labeled for convenience of illustration. In conductive traces 52, pads 46 and terminals 50 generally have identical shapes and sizes whereas routing lines 48 may (but need not) have different routing configurations. For instance, some conductive traces 52 may be spaced and separated and electrically isolated from one another whereas other conductive traces 52 can intersect or route to the same pad 46, routing line 48 or terminal 50 and be electrically connected to one another. Likewise, some pads 46 may receive independent signals whereas other pads 46 share a common signal, power or ground.

Thermal board 62 can be adapted for an LED package with blue, green and red LED chips, with each LED chip including an anode and a cathode and each LED package including a corresponding anode terminal and cathode terminal. In this instance, thermal board 62 can include six pads 46 and four terminals 50 so that each anode is routed from a separate pad 46 to a separate terminal 50 whereas each cathode is routed from a separate pad 46 to a common ground terminal 50.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 52 after they are formed. A plating bus can be disconnected during the wet chemical etch that forms pad 46, routing line 48 and terminal 50.

Thermal board 62 can include registration holes (not shown) that are drilled or sliced through base 24, adhesive tape 26, substrate 30 and solder mask 56 so that thermal board 62 can be positioned by inserting tooling pins through the registration holes when it is subsequently mounted on an underlying carrier.

Thermal board 62 can accommodate multiple semiconductor devices rather than one. This can be accomplished by adjusting etch mask 16 to define additional posts 22, adjusting adhesive tape 26 to include additional openings 36, adjusting substrate 30 to include additional apertures 38, adjusting etch mask 42 to define additional pads 46, routing lines 48 and terminals 50, and adjusting solder mask 56 to contain additional openings to expose the additional posts 22, pads 46 and terminals 50. The elements except for terminals 50 can be laterally repositioned to provide a 2×2 array for four semiconductor devices. In addition, the topography (lateral shape) can be adjusted for some but not all of the elements. For instance, pads 46 and terminals 50 can retain the same topography whereas routing lines 48 have different routing configurations.

Figure 4A:
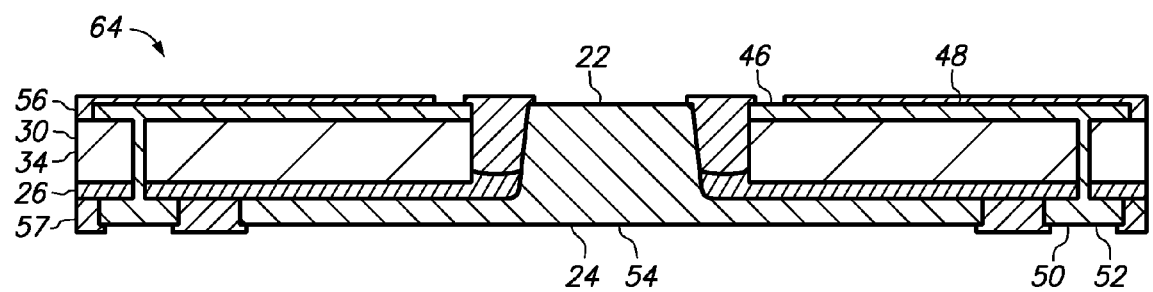
FIGS. 4A, 4B and 4C are cross-sectional, top and bottom views, respectively, of a thermal board with vertical signal routing in accordance with an embodiment of the present invention.
Figure 4B:
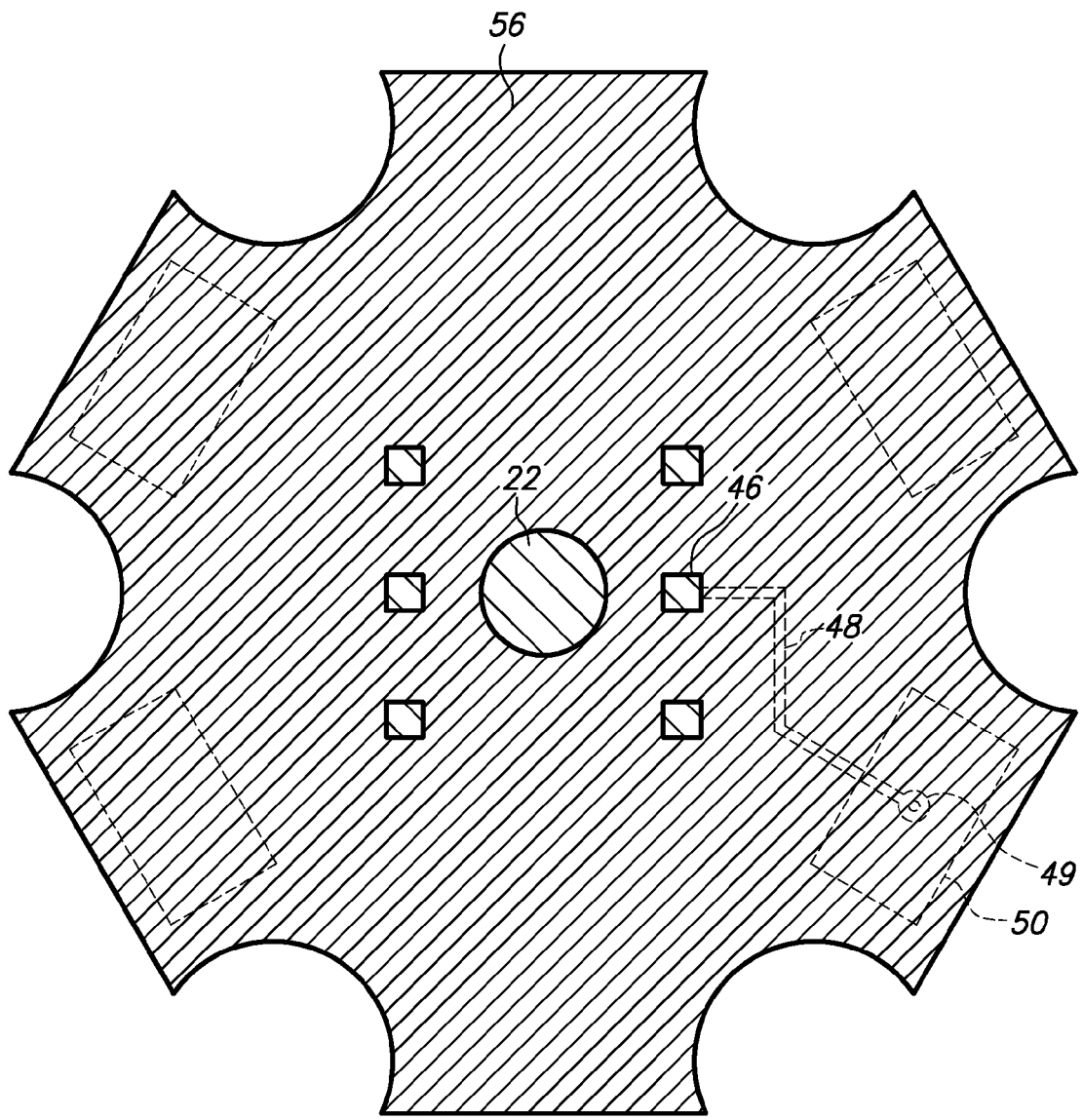
Figure 4C:
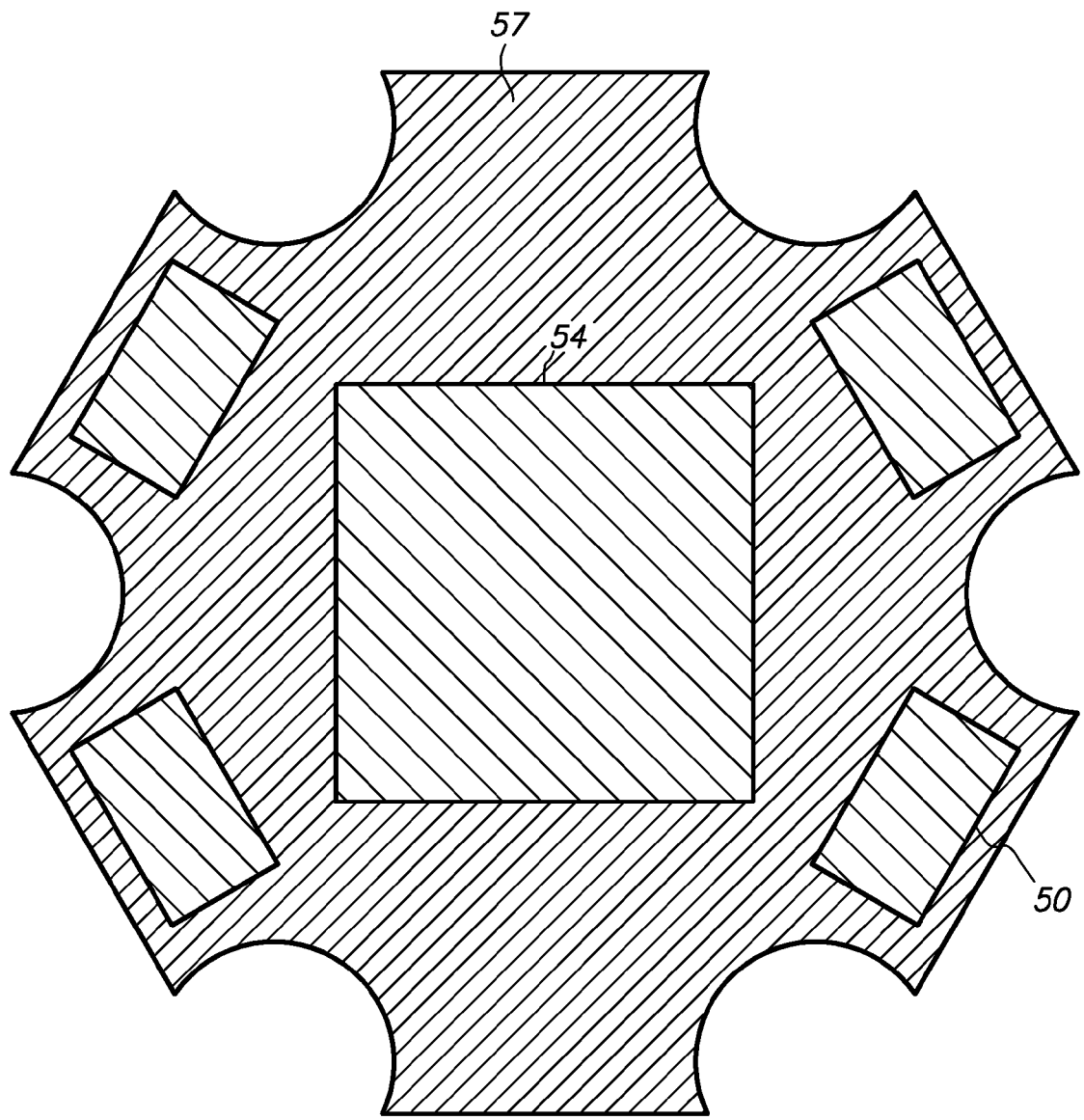

FIGS. 4A, 4B and 4C are cross-sectional, top and bottom views, respectively, of a thermal board with vertical signal routing in accordance with an embodiment of the present invention.

In this embodiment, the terminal is located at the bottom of the thermal board. For purposes of brevity, any description of thermal board 62 is incorporated herein insofar as the same is applicable, and the same description need not be repeated. Likewise, elements of the thermal board similar to those in thermal board 62 have corresponding reference numerals.

Thermal board 64 includes adhesive tape 26, substrate 30, conductive trace 52, heat spreader 54 and solder masks 56 and 57. Substrate 30 includes dielectric layer 34. Conductive trace 52 includes pad 46, routing line 48, via 49 and terminal 50. Heat spreader 54 includes post 22 and base 24.

Base 24 is thinner in this embodiment than the previous embodiment and is spaced from the peripheral edges of thermal board 64. Base 24 covers post 22 but not adhesive tape 26, substrate 30, conductive trace 52 or solder masks 56 and 57 in the downward direction. Base 24 also supports substrate 30 and is coplanar with terminal 50 below adhesive tape 26.

Via 49 is an electrical conductor that extends vertically from routing line 48 through dielectric layer 34 and adhesive tape 26 to terminal 50. Furthermore, terminal 50 contacts and extends below adhesive tape 26, is spaced from and extends below substrate 30 and is spaced from and located between base 24 and the peripheral edges of thermal board 64. Thus, adhesive tape 26 extends laterally from post 22 beyond and overlaps terminal 50, via 49 is adjacent to and electrically connects routing line 48 and terminal 50, and conductive trace 52 provides vertical (top to bottom) signal routing from pad 46 to terminal 50.

Solder mask 57 is an electrically insulative layer similar to solder mask 56 that exposes base 24 and terminal 50 and covers the exposed portions of adhesive tape 26 in the downward direction.

Thermal board 64 can be manufactured in a manner similar to thermal board 62 with suitable adjustments for base 24, conductive trace 52 and solder masks 56 and 57. For instance, metal plate 10 has a thickness of 180 microns (rather than 500 microns) so that base 24 has a thickness of 30 microns (rather than 350 microns). Thereafter, adhesive tape 26 and substrate 30 are mounted on base 24 and pressure is applied to attach base 24 to adhesive tape 26. Next, a hole is drilled downward through conductive layer 32, dielectric layer 34 and adhesive tape 26 into but not through base 24 and then via 49 is deposited into the hole by electroplating, screen printing or dispensing by an injection nozzle in step-and-repeat fashion. Thereafter, conductive layer 32 is etched to form pad 46 and routing line 48 and base 24 is etched to form terminal 50. Base 24 as etched is reduced to its central portion and terminal 50 is an unetched portion of base 24 that contacts and extends below adhesive tape 26, is spaced and separated from and no longer a part of base 24 and is adjacent to via 49. Thereafter, solder mask 56 is formed on the top surface to selectively expose post 22 and pad 46, solder mask 57 is formed on the bottom surface to selectively expose base 24 and terminal 50 and then plated contacts 60 provide a surface finish for post 22, base 24, pad 46 and terminal 50.

Figure 5A:
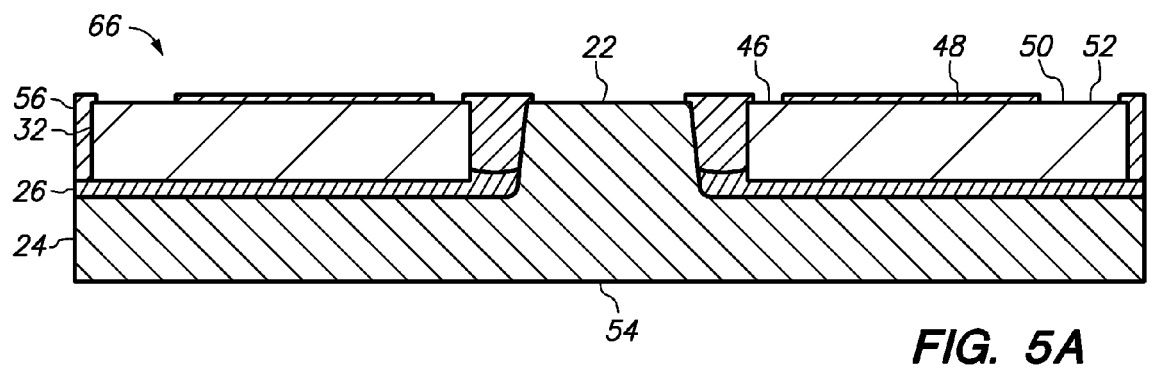
FIGS. 5A, 5B and 5C are cross-sectional, top and bottom views, respectively, of a thermal board with a conductive trace on an adhesive tape in accordance with an embodiment of the present invention.
Figure 5B:
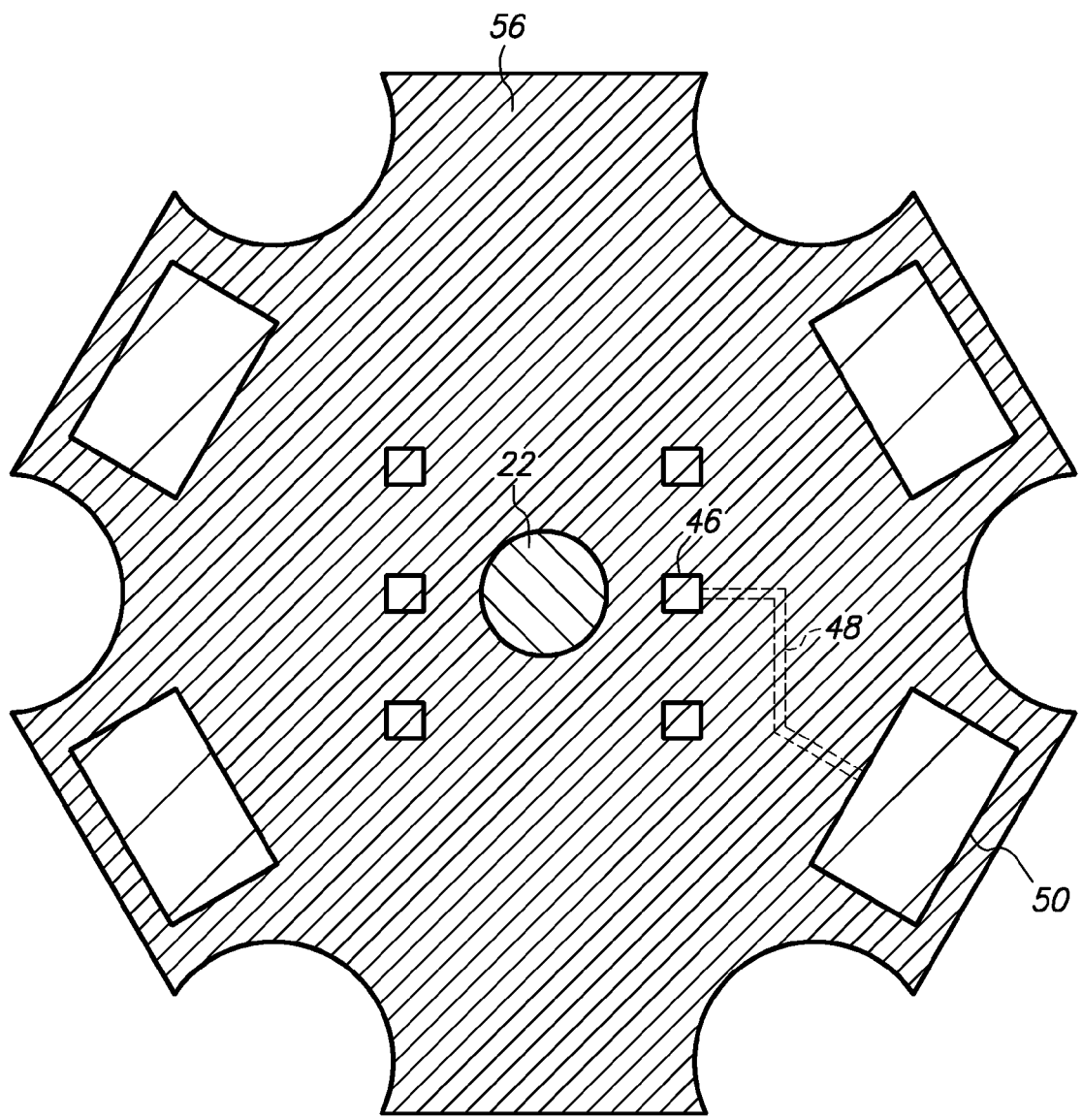
Figure 5C:
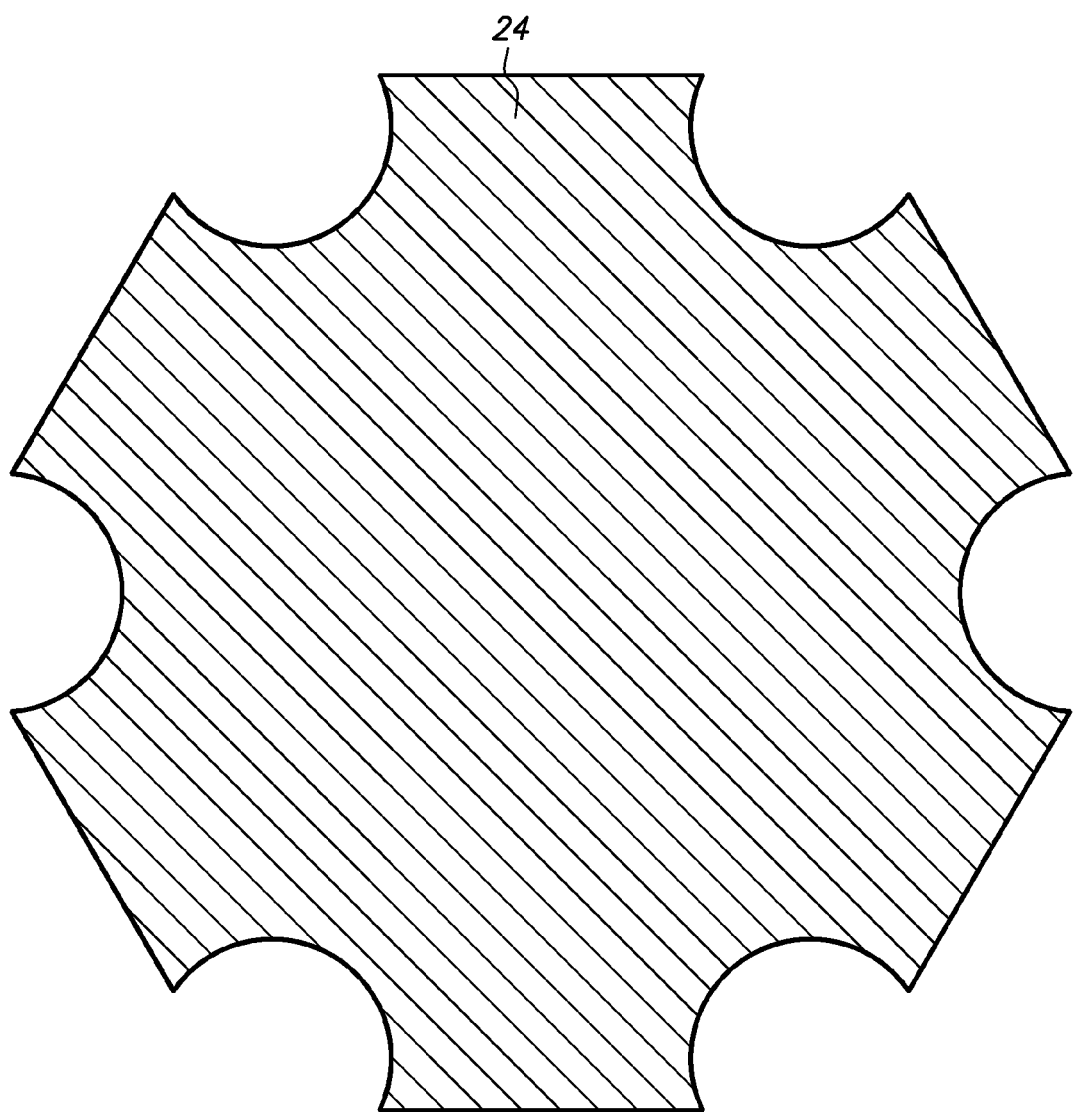

FIGS. 5A, 5B and 5C are cross-sectional, top and bottom views, respectively, of a thermal board with a conductive trace on an adhesive tape in accordance with an embodiment of the present invention.

In this embodiment, the conductive trace contacts the adhesive tape and the dielectric layer is omitted. For purposes of brevity, any description of thermal board 62 is incorporated herein insofar as the same is applicable, and the same description need not be repeated. Likewise, elements of the thermal board similar to those in thermal board 62 have corresponding reference numerals.

Thermal board 66 includes adhesive tape 26, conductive trace 52, heat spreader 54 and solder mask 56. Conductive trace 52 includes pad 46, routing line 48 and terminal 50. Heat spreader 54 includes post 22 and base 24.

Conductive layer 32 is thicker in this embodiment than the previous embodiment. For instance, conductive layer 32 has a thickness of 125 microns (rather than 30 microns) so that it can be handled without warping or wobbling. Pad 46, routing line 48 and terminal 50 are therefore thicker and contact and overlap adhesive tape 26, and thermal board 66 is devoid of a dielectric layer corresponding to dielectric layer 34.

Thermal board 66 can be manufactured in a manner similar to thermal board 62 with suitable adjustments for post 22 and conductive layer 32. For instance, post 22 has a height of 100 microns (rather than 150 microns) so that base 24 has a thickness of 400 microns (rather than 350 microns). This can be accomplished by reducing the etch time. Thereafter, adhesive tape 26 and conductive layer 32 are mounted on adhesive tape 26 and pressure is applied to attach base 24 to adhesive tape 26, as previously described. Thereafter, conductive layer 32 is etched to form pad 46, routing line 48 and terminal 50, solder mask 56 is formed on the top surface to expose post 22, pad 46 and terminal 50 and then plated contacts 60 provide a surface finish for post 22, base 24, pad 46 and terminal 50.

Figure 6A:
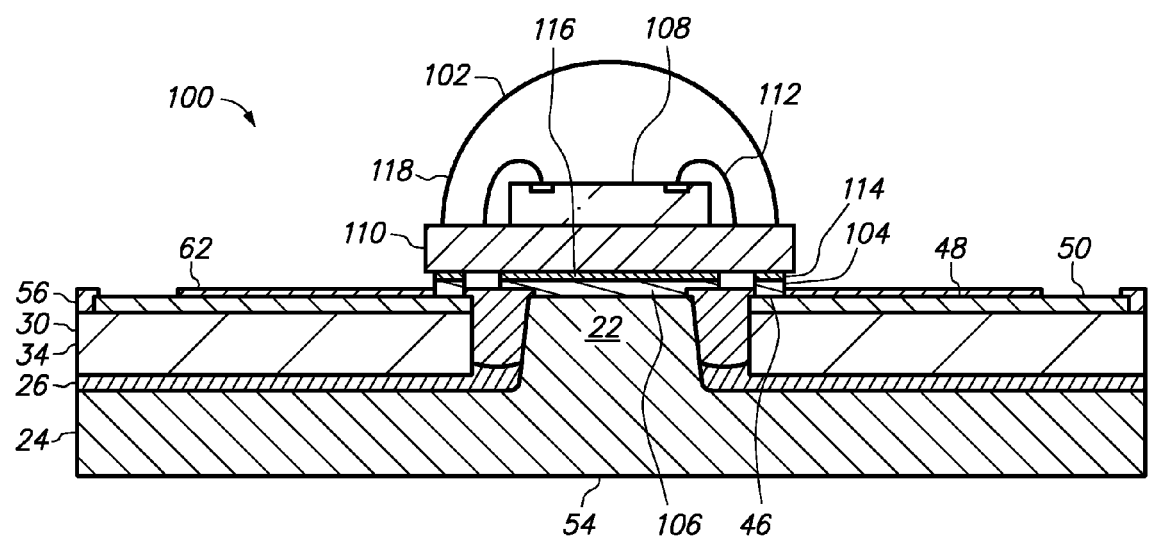
FIGS. 6A, 6B and 6C are cross-sectional, top and bottom views, respectively, of a semiconductor chip assembly that includes a thermal board and an LED package with backside contacts accordance with an embodiment of the present invention.
Figure 6B:
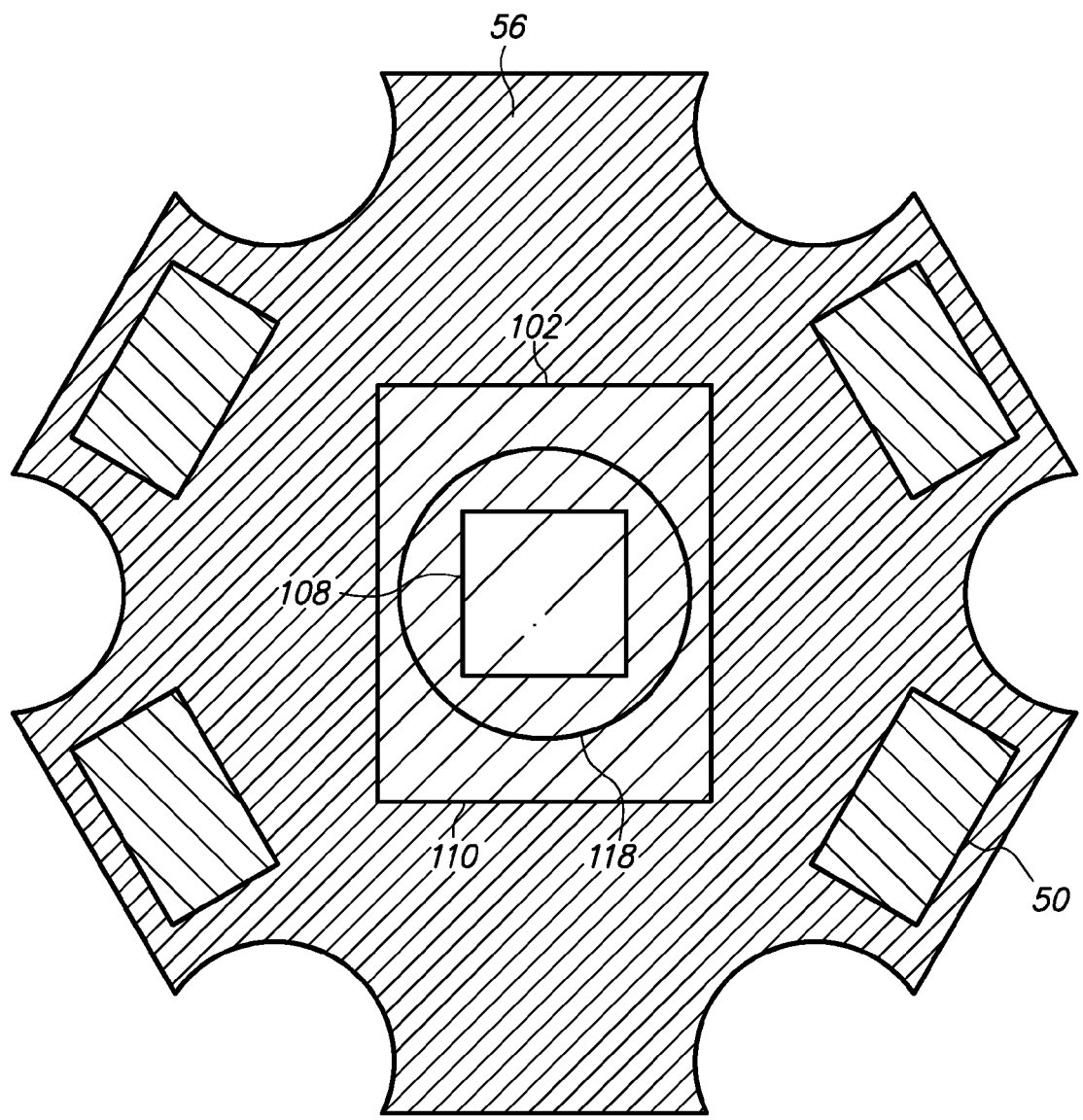
Figure 6C:
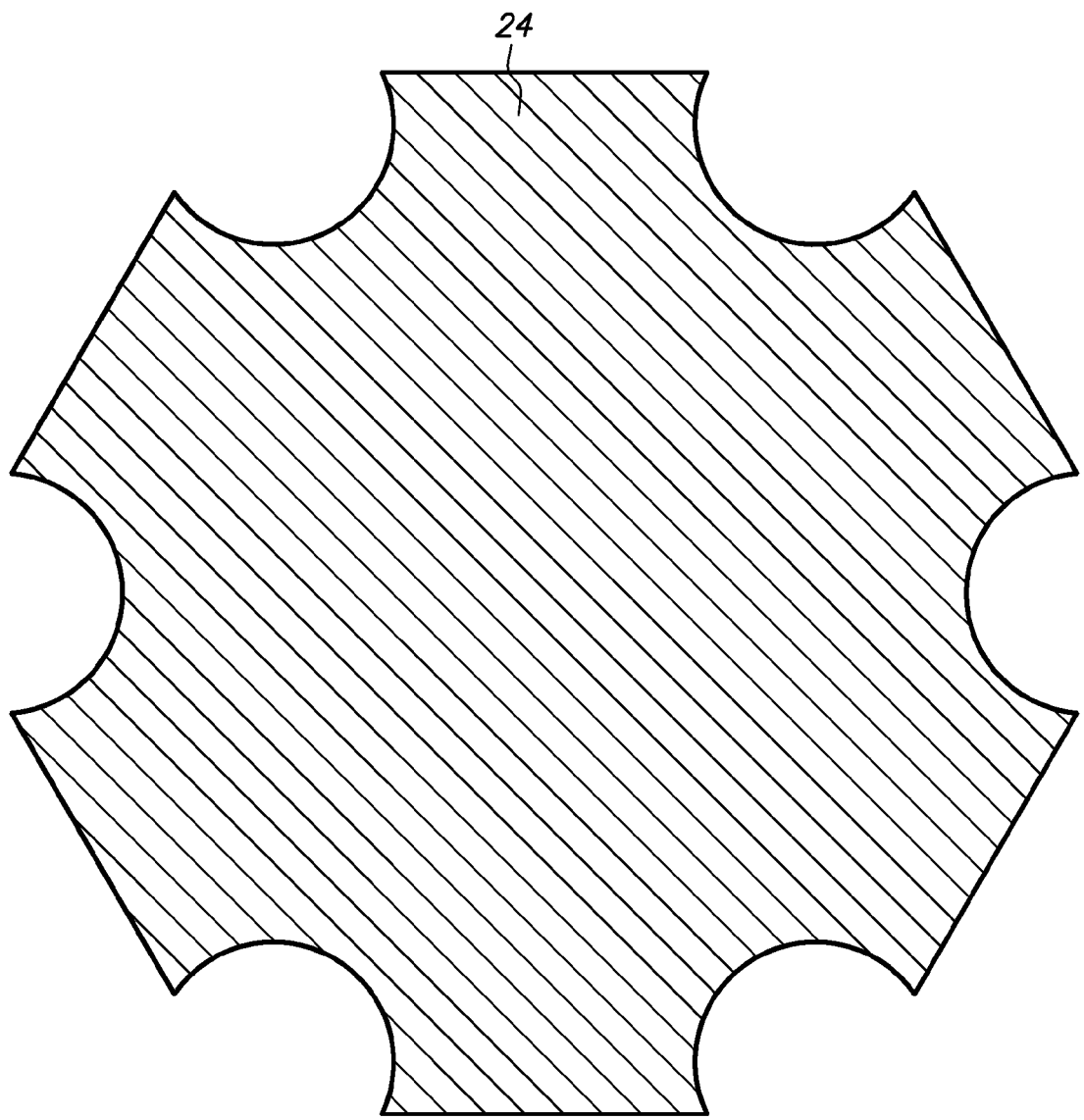

FIGS. 6A, 6B and 6C are cross-sectional, top and bottom views, respectively, of a semiconductor chip assembly that includes a thermal board an LED package with backside contacts in accordance with an embodiment of the present invention.

Semiconductor chip assembly 100 includes thermal board 62, LED package 102 and solder joints 104 and 106. LED package 102 includes LED chip 108, submount 110, wire bond 112, electrical contact 114, thermal contact 116 and transparent encapsulant 118. LED chip 108 includes an electrode (not shown) electrically connected to a via (not shown) in submount 110 by wire bond 112, thereby electrically connecting LED chip 108 to electrical contact 114. LED chip 108 is mounted on and thermally connected to and mechanically attached to submount 110 by a die attach (not shown), thereby thermally connecting LED chip 108 to thermal contact 116. Submount 110 is a ceramic block with low electrical conductivity and high thermal conductivity, and contacts 114 and 116 are plated on and protrude downwardly from the backside of submount 110.

LED package 102 is mounted on substrate 30 and heat spreader 54, electrically connected to substrate 30 and thermally connected to heat spreader 54. In particular, LED package 102 is mounted on post 22 and pad 46, is electrically connected to substrate 30 by solder joint 104 and is thermally connected to heat spreader 54 by solder joint 106. For instance, solder joint 104 contacts and is sandwiched between and electrically connects and mechanically attaches pad 46 and electrical contact 114, thereby electrically connecting LED chip 108 to terminal 50. Likewise, solder joint 106 contacts and is sandwiched between and thermally connects and mechanically attaches post 22 and thermal contact 116, thereby thermally connecting LED chip 108 to base 24. Pad 46 is spot plated with nickel/gold to bond well with solder joint 104 and is shaped and sized to match electrical contact 114, thereby improving signal transfer from substrate 30 to LED package 102. Likewise, post 22 is spot plated with nickel/gold to bond well with solder joint 106 and is shaped and sized to accommodate thermal contact 116, thereby improving heat transfer from LED package 102 to heat spreader 54.

Transparent encapsulant 118 is a solid adherent electrically insulative protective plastic enclosure that provides environmental protection such as moisture resistance and particle protection for LED chip 108 and wire bond 112. LED chip 108 and wire bond 112 are embedded in transparent encapsulant 118.

Semiconductor chip assembly 100 can be manufactured by depositing a solder material on post 22 and pad 46, then placing contacts 114 and 116 on the solder material over pad 46 and post 22, respectively, and then reflowing the solder material to provide solder joints 104 and 106.

For instance, solder paste is selectively screen printed on post 22 and pad 46, then LED package 102 is positioned over thermal board 62 using a pick-up head and an automated pattern recognition system in step-and-repeat fashion. The pick-up head places contacts 114 and 116 on the solder paste over pad 46 and post 22, respectively. Next, the solder paste is heated and reflowed at a relatively low temperature such as 190° C. and then the heat is removed and the solder paste cools and solidifies to form hardened solder joints 104 and 106. Alternatively, solder balls are placed on post 22 and pad 46, then contacts 114 and 116 are placed on the solder balls over pad 46 and post 22, respectively, and then the solder balls are heated and reflowed to form solder joints 104 and 106.

The solder material can be initially deposited on thermal board 62 or LED package 102 by plating or printing or placement techniques, then sandwiched between thermal board 62 and LED package 102 and then reflowed. The solder material can also be deposited on terminal 50 if required for the next level assembly. Furthermore, a conductive adhesive such as silver-filled epoxy or other connection media can be used instead of solder, and the connection media on post 22, pad 46 and terminal 50 need not be the same.

Semiconductor chip assembly 100 is a second-level single-chip module.

Figure 7A:
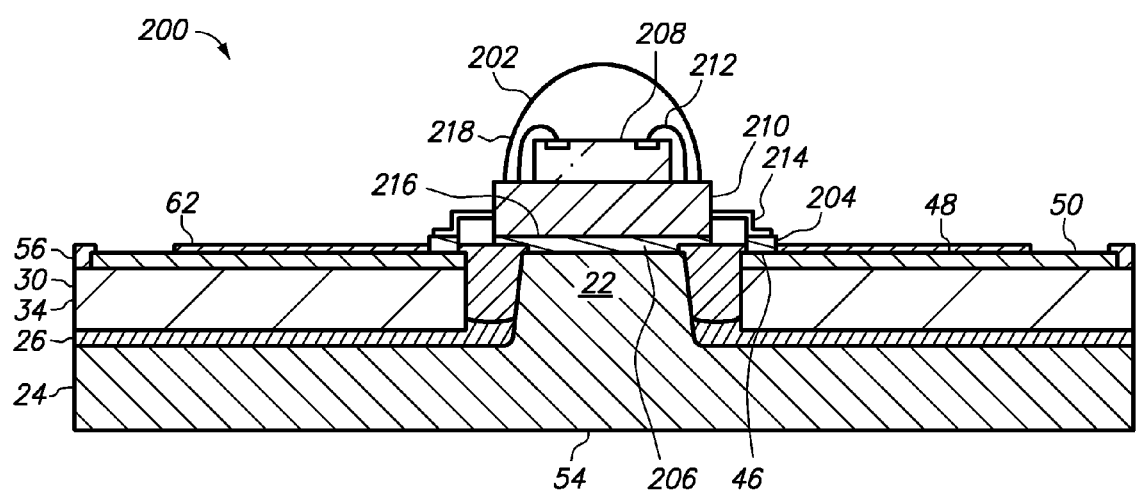
FIGS. 7A, 7B and 7C are cross-sectional, top and bottom views, respectively, of a semiconductor chip assembly that includes a thermal board and an LED package with lateral leads in accordance with an embodiment of the present invention.
Figure 7B:
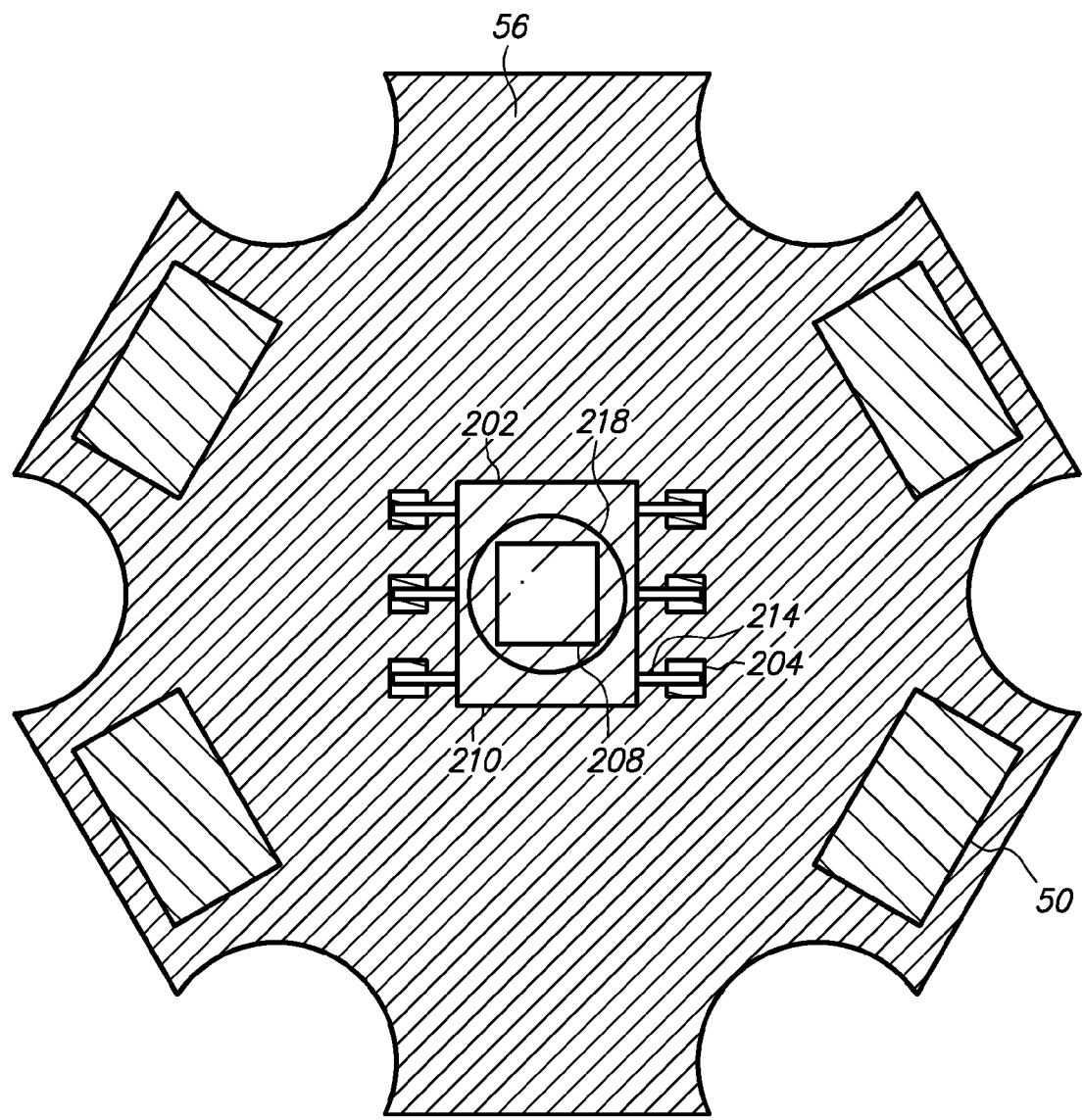
Figure 7C:
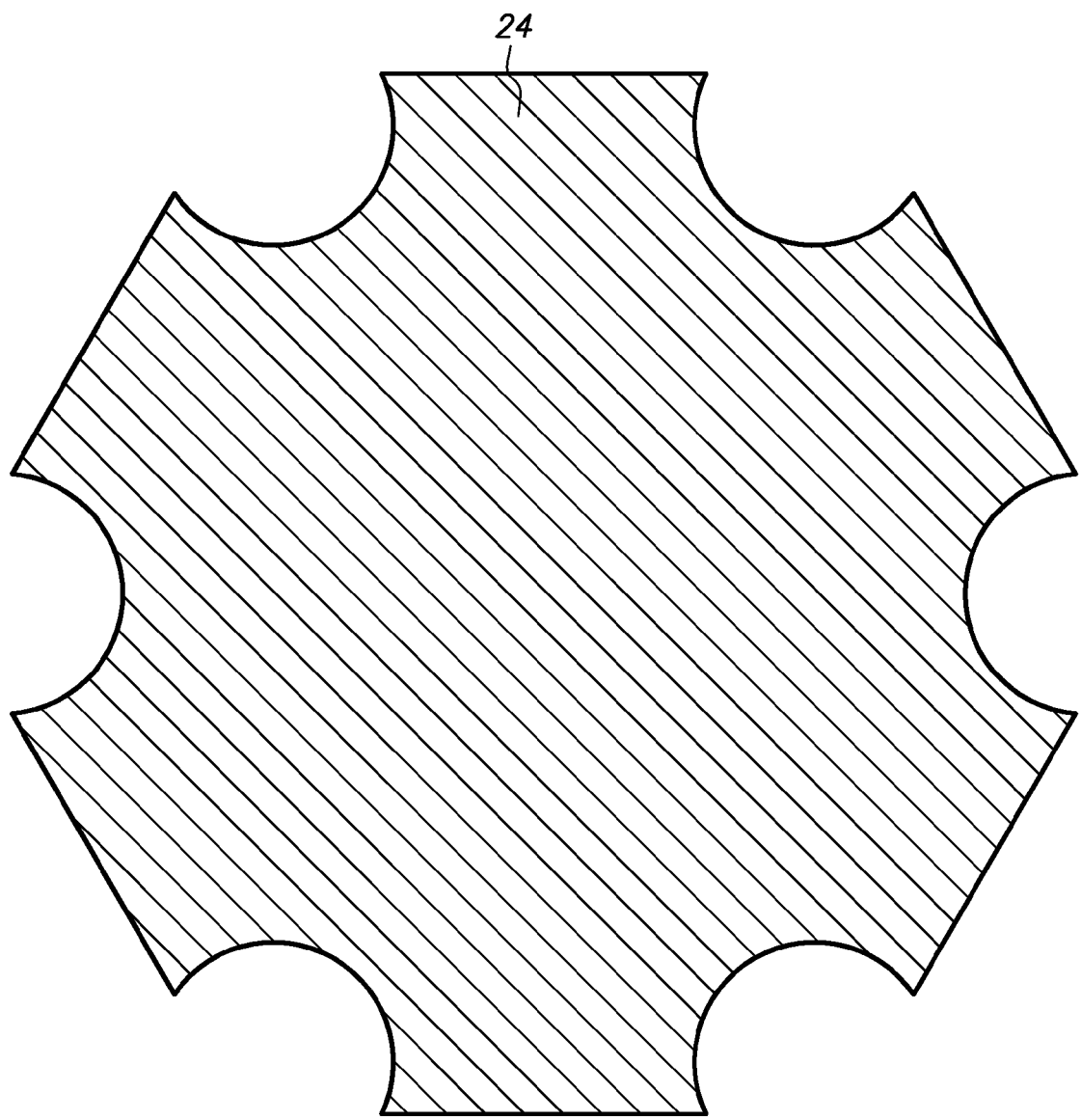

FIGS. 7A, 7B and 7C are cross-sectional, top and bottom views, respectively, of a semiconductor chip assembly that includes a thermal board and an LED package with lateral leads in accordance with an embodiment of the present invention.

In this embodiment, the LED package has lateral leads rather than backside contacts. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 208 corresponds to LED chip 108, submount 210 corresponds to submount 110, etc.

Semiconductor chip assembly 200 includes thermal board 62, LED package 202 and solder joints 204 and 206. LED package 202 includes LED chip 208, submount 210, wire bond 212, lead 214 and transparent encapsulant 218. LED chip 208 is electrically connected to lead 214 by wire bond 212. Submount 210 includes thermal contact surface 216 at its backside, is narrower than submount 110 and has the same lateral size and shape as thermal contact 116. LED chip 208 is mounted on and thermally connected to and mechanically attached to submount 210 by a die attach (not shown), thereby thermally connecting LED chip 208 to thermal contact surface 216. Lead 214 extends laterally from submount 210 and thermal contact surface 216 faces downward.

LED package 202 is mounted on substrate 30 and heat spreader 54, electrically connected to substrate 30 and thermally connected to heat spreader 54. In particular, LED package 202 is mounted on post 22 and pad 46, is electrically connected to substrate 30 by solder joint 204 and is thermally connected to heat spreader 54 by solder joint 206. For instance, solder joint 204 contacts and is sandwiched between and electrically connects and mechanically attaches pad 46 and lead 214, thereby electrically connecting LED chip 208 to terminal 50. Likewise, solder joint 206 contacts and is sandwiched between and thermally connects and mechanically attaches post 22 and thermal contact surface 216, thereby thermally connecting LED chip 208 to base 24.

Semiconductor chip assembly 200 can be manufactured by depositing a solder material on post 22 and pad 46, then placing lead 214 and thermal contact surface 216 on the solder material over pad 46 and post 22, respectively, and then reflowing the solder material to provide solder joints 204 and 206.

Semiconductor chip assembly 200 is a second-level single-chip module.

Figure 8A:
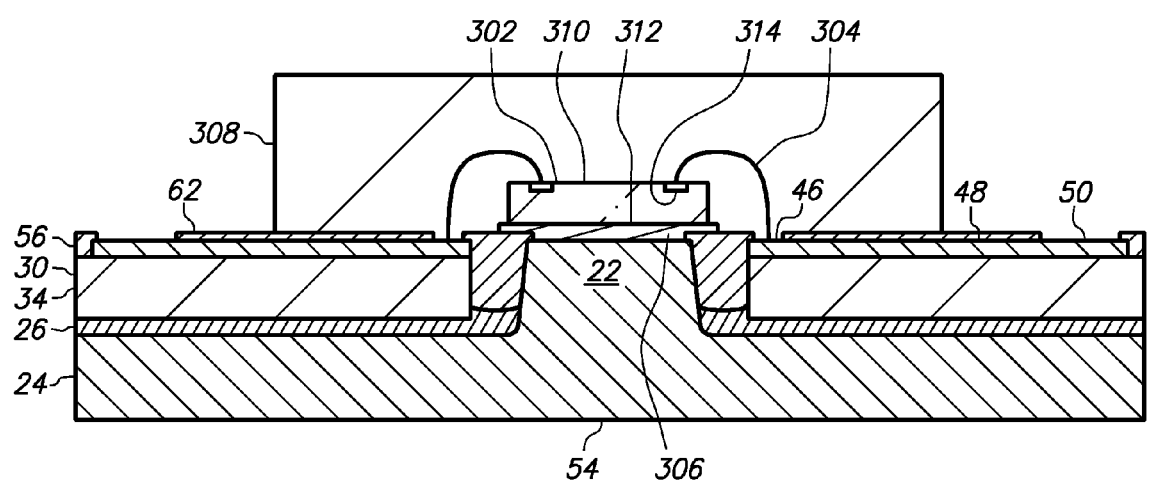
FIGS. 8A, 8B and 8C are cross-sectional, top and bottom views, respectively, of a semiconductor chip assembly that includes a thermal board and a semiconductor chip in accordance with an embodiment of the present invention.
Figure 8B:
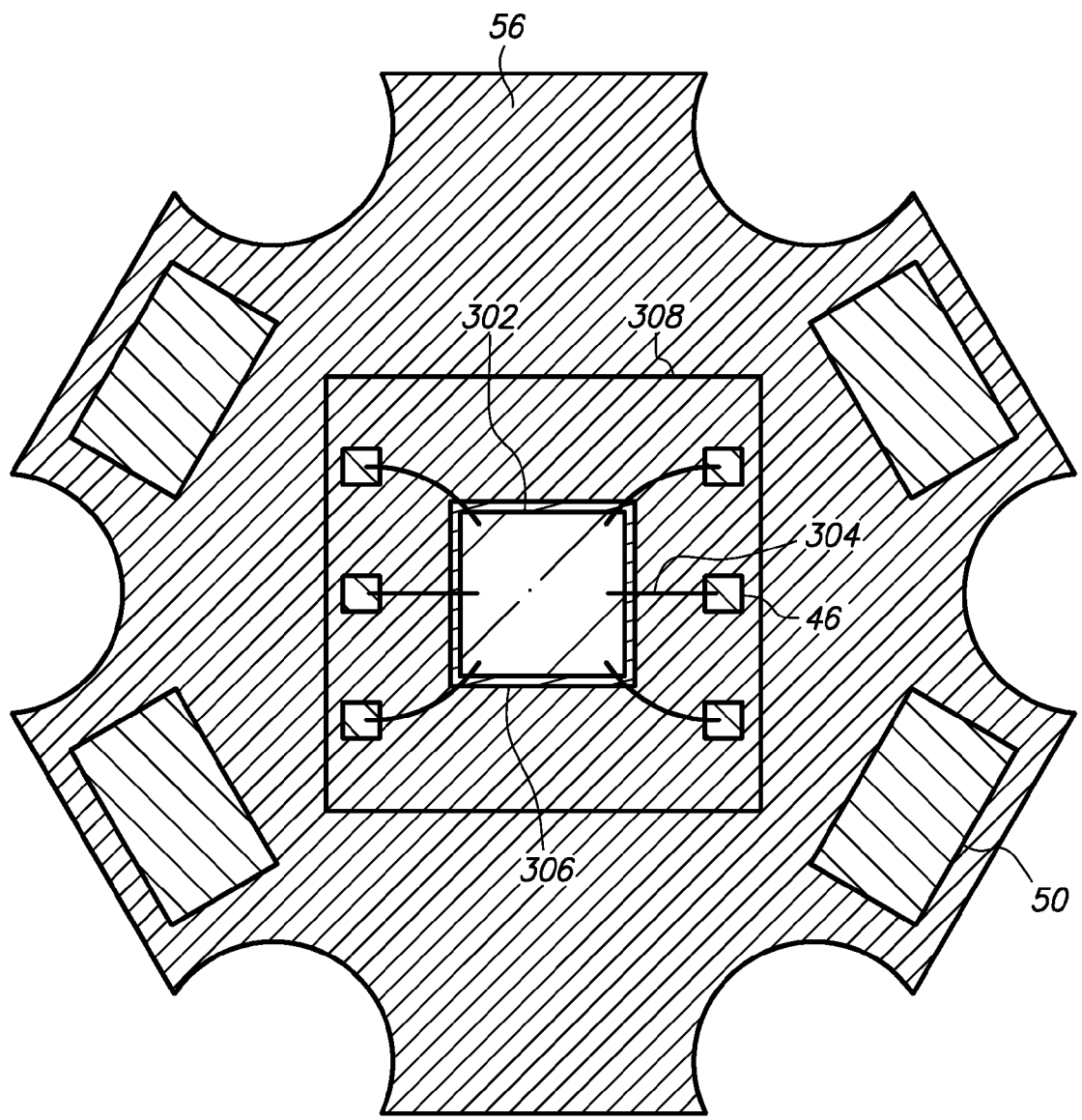
Figure 8C:
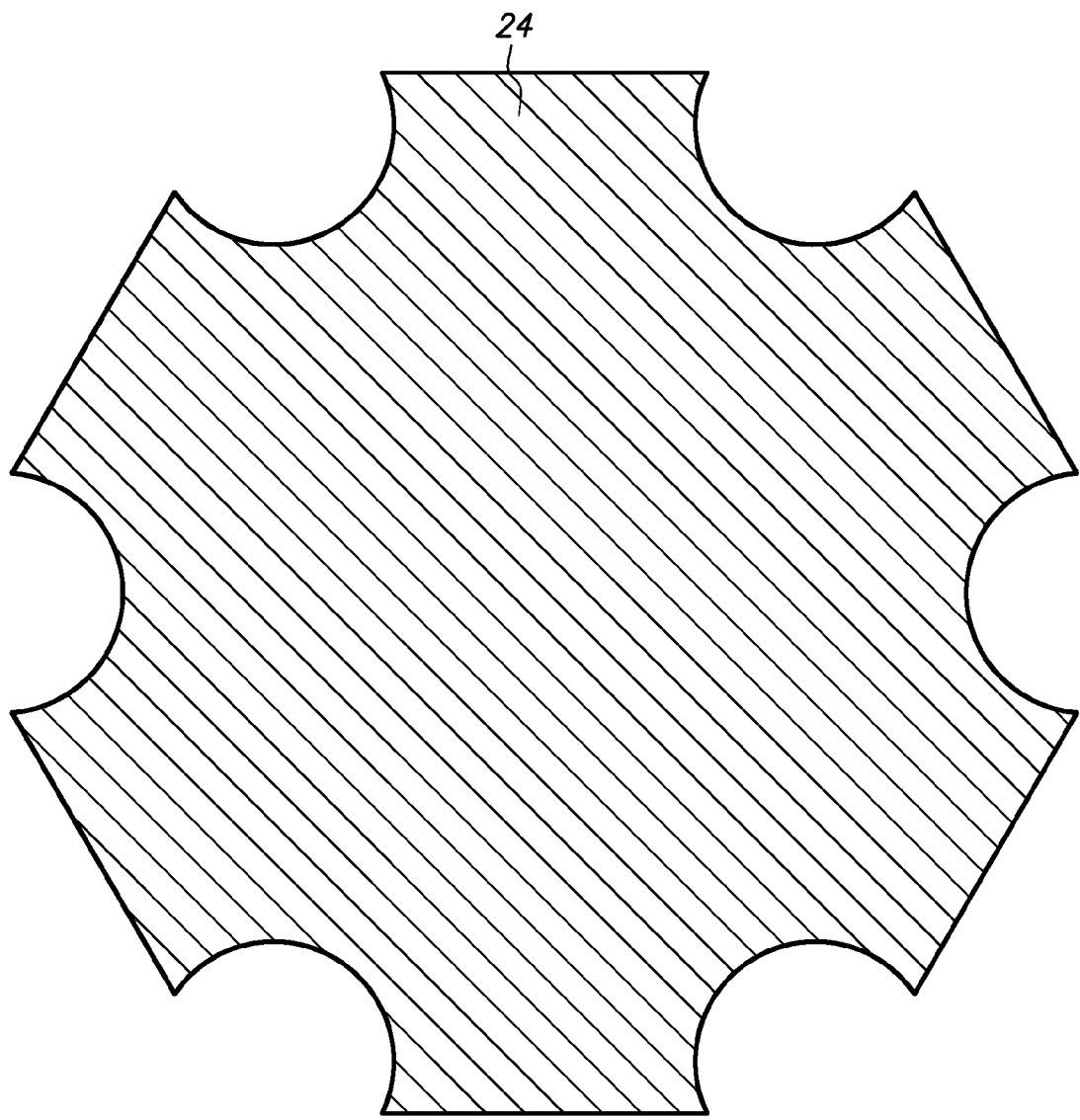

FIGS. 8A, 8B and 8C are cross-sectional, top and bottom views, respectively, of a semiconductor chip assembly that includes a thermal board and a semiconductor chip in accordance with an embodiment of the present invention.

In this embodiment, the semiconductor device is a chip rather than a package and the chip is mounted on the heat spreader but not the substrate. Furthermore, the chip overlaps the post but not the substrate, is electrically connected to the pad using a wire bond and is thermally connected to the post using a die attach.

Semiconductor chip assembly 300 includes thermal board 62, chip 302, wire bond 304, die attach 306 and encapsulant 308. Chip 302 includes top surface 310, bottom surface 312 and bond pad 314. Top surface 310 is the active surface and includes bond pad 314 and bottom surface 312 is the thermal contact surface.

Chip 302 is mounted on heat spreader 54, electrically connected to substrate 30 and thermally connected to heat spreader 54. In particular, chip 302 is mounted on post 22, is within the periphery of post 22, overlaps post 22 but does not overlap substrate 30, is electrically connected to substrate 30 by wire bond 304 and is thermally connected to and mechanically attached to heat spreader 54 by die attach 306. For instance, wire bond 304 is bonded to and electrically connects pads 46 and 314, thereby electrically connecting chip 302 to terminal 50. Likewise, die attach 306 contacts and is sandwiched between and thermally connects and mechanically attaches post 22 and thermal contact surface 312, thereby thermally connecting chip 302 to base 24. Pad 46 is spot plated with nickel/silver to bond well with wire bond 304, thereby improving signal transfer from substrate 30 to chip 302, and post 22 is shaped and sized to accommodate thermal contact surface 312, thereby improving heat transfer from chip 302 to heat spreader 54.

Encapsulant 308 is a solid adherent electrically insulative protective plastic enclosure that provides environmental protection such as moisture resistance and particle protection for chip 302 and wire bond 304. Chip 302 and wire bond 304 are embedded in encapsulant 308. Furthermore, encapsulant 308 can be transparent if chip 302 is an optical chip such as an LED. Encapsulant 308 is transparent in FIG. 8B for convenience of illustration.

Semiconductor chip assembly 300 can be manufactured by mounting chip 302 on post 22 using die attach 306, then wire bonding pads 46 and 314 and then forming encapsulant 308.

For instance, die attach 306 is initially a silver-filled epoxy paste with high thermal conductivity that is selectively screen printed on post 22 and then chip 302 placed on the epoxy paste using a pick-up head and an automated pattern recognition system in step-and-repeat fashion. Thereafter, the epoxy paste is heated and hardened at a relatively low temperature such as 190° C. to form die attach 306. Next, wire bond 304 is a gold wire that is thermosonically ball bonded to pads 46 and 314 and then encapsulant 308 is transfer molded on the structure.

Chip 302 can be electrically connected to pad 46 by a wide variety of connection media, thermally connected to and mechanically attached to heat spreader 54 by a wide variety of thermal adhesives and encapsulated by a wide variety of encapsulants.

Semiconductor chip assembly 300 is a first-level single-chip package.

Figure 9A:
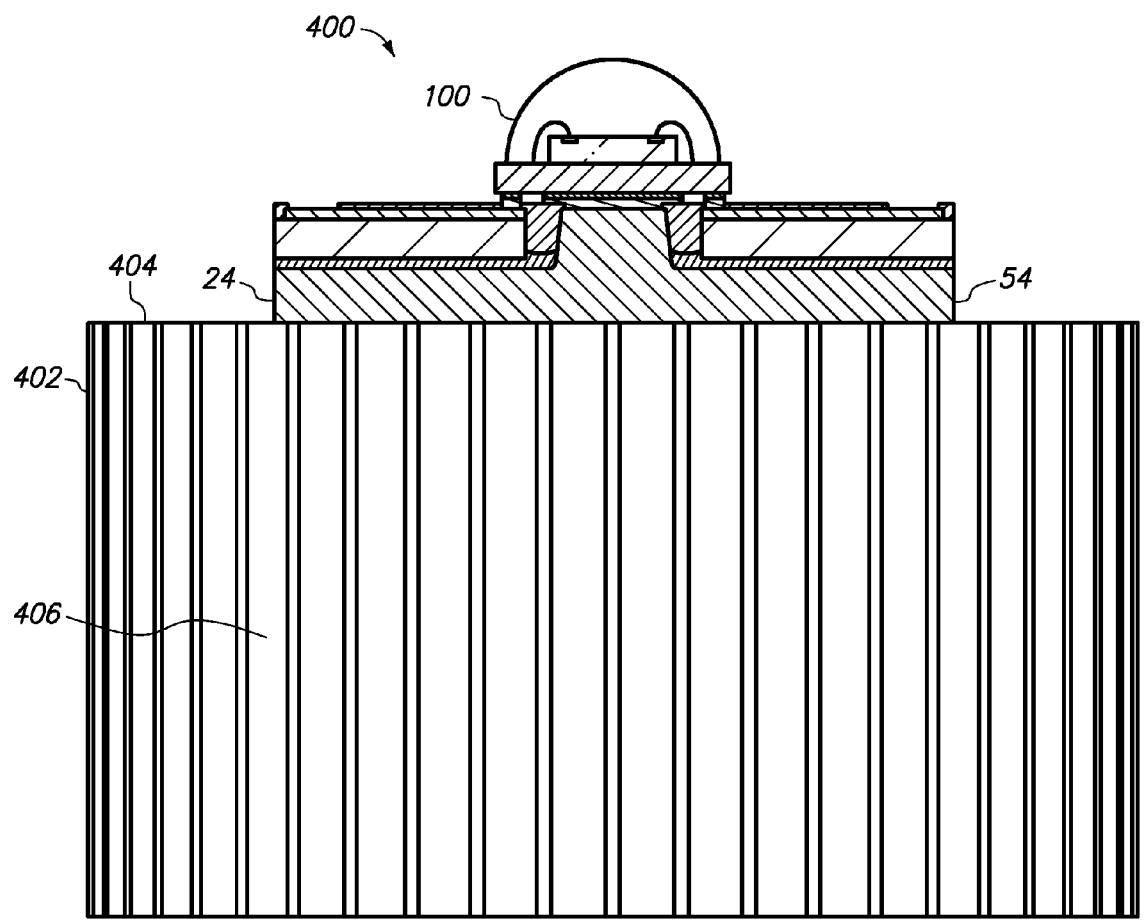
FIGS. 9A, 9B and 9C are cross-sectional, top and bottom views, respectively, of a light source subassembly that includes a semiconductor chip assembly and a heat sink in accordance with an embodiment of the present invention.
Figure 9B:
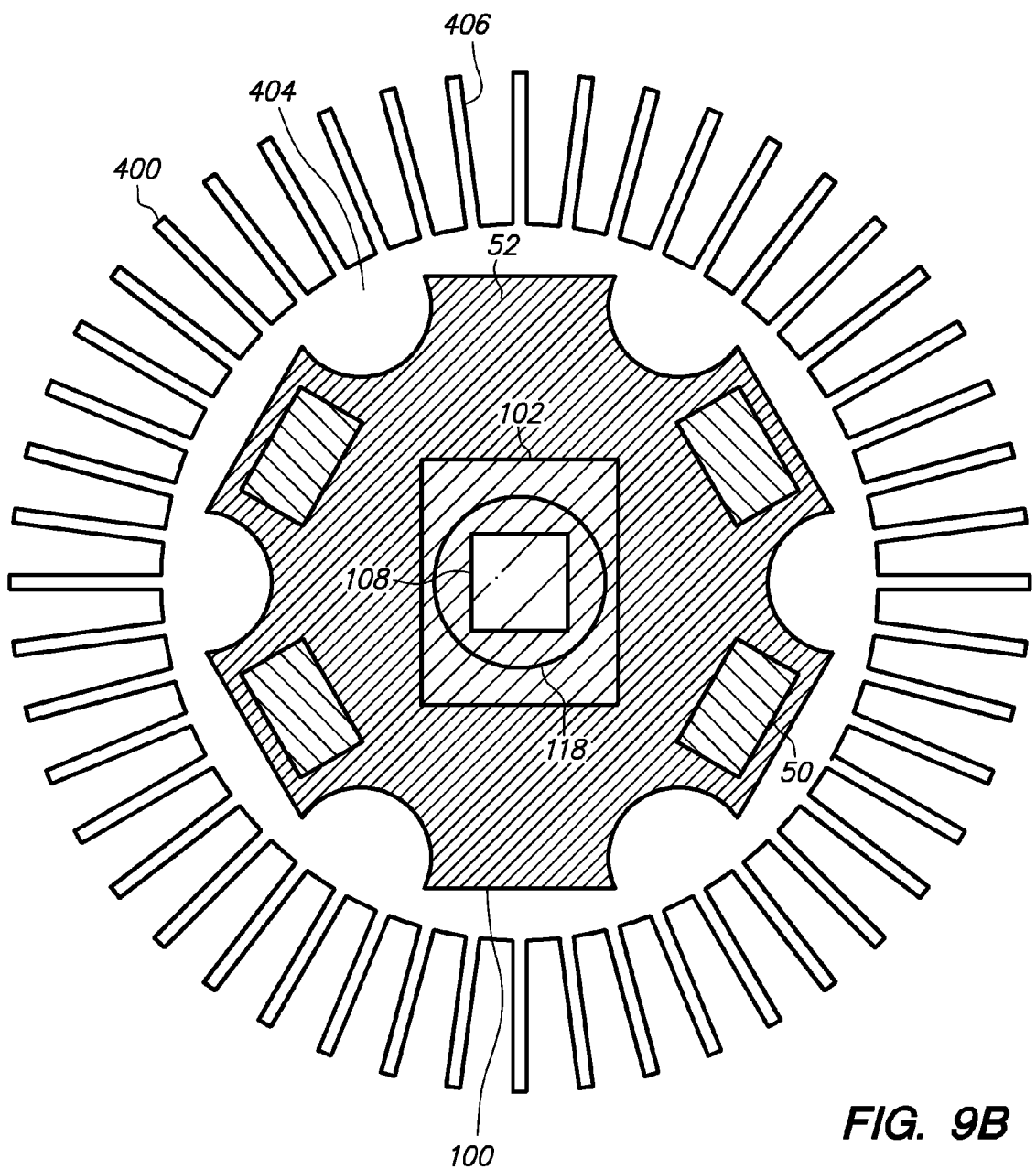
Figure 9C:
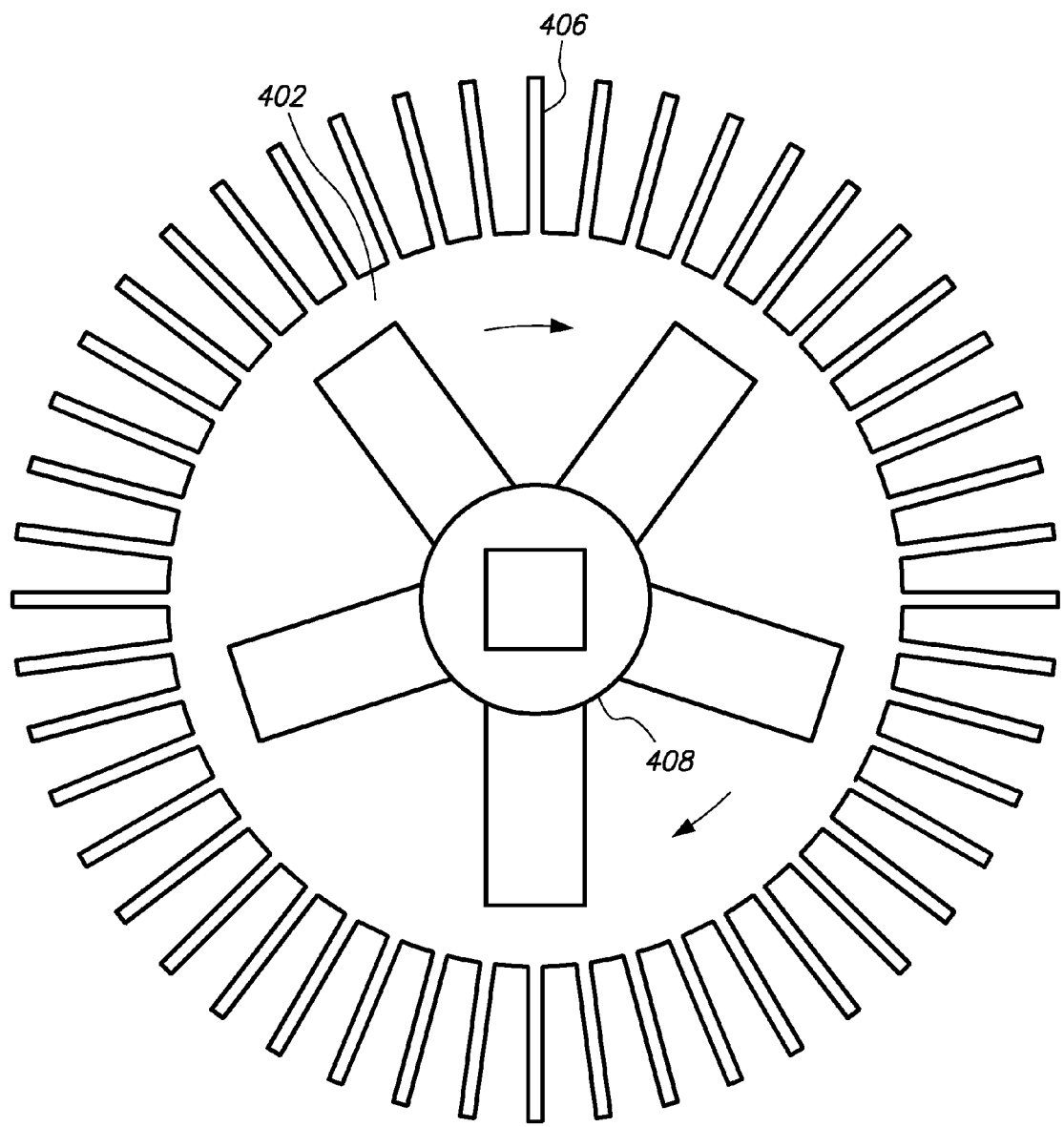

FIGS. 9A, 9B and 9C are cross-sectional, top and bottom views, respectively, of a light source subassembly that includes a semiconductor chip assembly and a heat sink in accordance with an embodiment of the present invention.

Light source subassembly 400 includes semiconductor chip assembly 100 and heat sink 402. Heat sink 402 includes thermal contact surface 404, fins 406 and fan 408. Assembly 100 is mounted on heat sink 402 and mechanically fastened to heat sink 402, for instance by screws (not shown). As a result, base 24 is clamped against and thermally connected to thermal contact surface 404, thereby thermally connecting heat spreader 54 to heat sink 402. Heat spreader 54 spreads the heat from LED chip 108 and transfers the spread heat to heat sink 402, which in turn dissipates the heat into the exterior environment using fins 406 and fan 408.

Light source subassembly 400 is designed for a light fixture (not shown) that is interchangeable with a standard incandescent light bulb. The light fixture includes subassembly 400, a glass cap, a threaded base, a control board, wiring and a housing. Subassembly 400, the control board and the wiring are enclosed within the housing. The wiring extends from the control board and is soldered to terminals 50. The glass cap and the threaded base protrude from opposite ends of the housing. The glass cap exposes LED chip 108, the threaded base is configured to screw into a light socket and the control board is electrically connected to terminals 50 by the wiring. The housing is a two-piece plastic shell with top and bottom pieces. The glass cap is attached to and protrudes above the top piece, the threaded base is attached to and protrudes below the bottom piece, and subassembly 400 and the control board are mounted on the bottom piece and extend into the top piece.

During operation, the threaded base transfers AC from a light socket to the control board, which converts the AC to modulated DC and the wiring transmits the modulated DC to terminal 50 and grounds another terminal 50. As a result, LED chip 108 illuminates bright light through the glass cap. LED chip 108 also generates intense localized heat that flows into and is spread by heat spreader 54 and flows from heat spreader 54 into heat sink 402 where fins 406 heat the air, and fan 408 blows the hot air radially outward through slots in the housing into the external environment.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the semiconductor device can be an LED package and the thermal board can provide vertical signal routing. The substrate can include single-level conductive traces and multi-level conductive traces. The thermal board can include multiple posts arranged in an array for multiple semiconductor devices and can include additional conductive traces to accommodate the additional semiconductor devices. Likewise, the semiconductor device can be an LED package with multiple LED chips and the thermal board can include additional conductive traces to accommodate the additional LED chips. The semiconductor device can be a semiconductor chip that overlaps the substrate and covers the post, the aperture and the opening in the upward direction.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the substrate can include additional conductive traces to receive and route additional wire bonds to the chips. This may be more cost effective than providing a miniature post for each chip.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesives, the substrate or elsewhere in the thermal board. As a result, the adhesives can have low thermal conductivity which drastically reduces cost. The heat spreader can include a post and base that are integral with one another, thereby enhancing reliability and reducing cost. The post can be nearly coplanar with the pad, thereby facilitating the electrical, thermal and mechanical connections with the semiconductor device. Furthermore, the post can be customized for the semiconductor device and the base can be customized for the next level assembly, thereby enhancing the thermal connection from the semiconductor device to the next level assembly. For instance, if the opening and the aperture are punched rather than drilled then the post can have a square or rectangular shape in a lateral plane with the same or similar topography as the thermal contact of the semiconductor device.

The heat spreader can be electrically connected to or isolated from the semiconductor device and the substrate. For instance, the die attach can be electrically conductive. Thereafter, the heat spreader can be electrically connected to ground, thereby electrically connecting the semiconductor device to ground.

The heat spreader can be copper, aluminum, copper/nickel/aluminum or other thermally conductive metallic structures.

The post can be deposited on or integral with the base. The post can be integral with the base when they are a single-piece metal such as copper or aluminum. The post can also be integral with the base when they include a single-piece metal such as copper at their interface as well as additional metal elsewhere such as a solder upper post portion and a copper lower post portion and base. The post can also be integral with the base when they share single-piece metals at their interface such as a copper coating on a nickel buffer layer on an aluminum core.

The post can include a flat top surface. For instance, the post can be nearly coplanar with the pad or the post can be etched after the second adhesive is solidified to provide a cavity in the second adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. The base can also cover the assembly in the downward direction when the terminal is above the dielectric layer, or alternatively, be spaced from the peripheral edges of the assembly when the terminal is below the adhesives. Furthermore, the base can include fins at its backside that protrude in the downward direction. For instance, the base can be cut at its bottom surface by a routing machine to form lateral grooves that define the fins. In this instance, the base can have a thickness of 700 microns, the grooves can have a depth of 500 microns and the fins can have a height of 500 microns. The fins can increase the surface area of the base, thereby increasing the thermal conductivity of the base by thermal convection when it remains exposed to the air rather than mounted on a heat sink.

The first adhesive can be a wide variety of adhesives including dielectric films, prepregs and tapes. For instance, the first adhesive can initially be an electrically insulative, pressure-sensitive adhesive tape that is subsequently mounted on the base and compressed to attach the base to the substrate. The adhesive tape can be fiberglass reinforced or unreinforced. Alternatively, the first adhesive can initially be an electrically insulative prepreg with thermosetting reinforced B-stage epoxy resin that is subsequently mounted on the base and cured to attach the base to the substrate. The epoxy can be FR-4, polyfunctional and bismaleimide triazine (BT), cyanate esters, polyimide and PTFE, the reinforcement can be E-glass, S-glass, D-glass, quartz, kevlar aramid and paper that is woven, non-woven or random microfiber, and a filler such as silica (powdered fused quartz) can be added to improve thermal conductivity, thermal shock resistance and thermal expansion matching. Preferably, the first adhesive is sufficiently thin, viscous or non-deformable that it fills little or none of the gap and remains spaced from the top surfaces of the post and the conductive layer as pressure is applied.

The second adhesive can be a wide variety of adhesives including thermosetting adhesives, thermoplastic adhesives and silicone adhesives. Preferably, the second adhesive is sufficiently fluid that it flows readily into the gap as it is deposited on the structure.

The adhesives can provide a robust mechanical bond between the heat spreader and the substrate. For instance, the adhesives can extend laterally from the post beyond the conductive trace to the peripheral edges of the assembly, the adhesives can fill the space between the heat spreader and the substrate and the adhesives can be void-free with consistent bond lines. The adhesives can also absorb thermal expansion mismatch between the heat spreader and the substrate. Furthermore, the adhesives can be low cost dielectrics that need not have high thermal conductivity. Moreover, the adhesives are not prone to delamination.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the first adhesive. For instance, the conductive layer can be mounted on the first adhesive so that the conductive layer contacts the first adhesive and is exposed in the upward direction and the post extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the first adhesive. For instance, the conductive layer can be provided on the dielectric layer, then the conductive layer and the dielectric layer can be mounted on the first adhesive so that the conductive layer is exposed in the upward direction, the dielectric layer contacts and is sandwiched between and separates the conductive layer and the first adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the first adhesive. For instance, the conductive layer can be attached to a carrier such biaxially-oriented polyethylene terephthalate polyester (Mylar) by a thin film, then the conductive layer and the carrier can be mounted on the first adhesive so that the carrier covers the conductive layer and is exposed in the upward direction, the thin film contacts and is sandwiched between the carrier and the conductive layer, the conductive layer contacts and is sandwiched between the thin film and the first adhesive, and the post is aligned with the aperture and covered in the upward direction by the carrier. After the first adhesive is attached to the base, the thin film can be decomposed by UV light so that the carrier can be peeled off the conductive layer, thereby exposing the conductive layer in the upward direction, and then the conductive layer can be patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad, the terminal and the routing line over the dielectric layer can be formed by numerous deposition techniques including electroplating, electroless plating, evaporating and sputtering as a single layer or multiple layers, either before or after the substrate is mounted on the first adhesive and either before or after the substrate is mounted on the base. For instance, the conductive layer can be patterned on the substrate before it is mounted on the first adhesive or after it is attached to the post and the base by the adhesives.

The plated contact surface finish can be formed before or after the pad and the terminal are formed. For instance, the plated layer can be deposited on the conductive layer and then patterned using the etch mask that defines the pad and the terminal.

The conductive trace can include additional pads, terminals, vias and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The dielectric layer and the plated contacts are generally desirable but may be omitted in some embodiments. For instance, if single-level signal routing is used then the dielectric layer may be omitted to reduce cost. Likewise, the plated contacts may be omitted to reduce cost.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference. Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive tape (first adhesive), a single substrate and a single solder mask (second adhesive) and then separated from one another. Likewise, numerous sets of heat spreaders and conductive traces that are each dedicated to a single semiconductor device can be simultaneously batch manufactured for each thermal board in the batch using a single metal plate, a single adhesive tape, a single substrate and a single solder mask.

For example, multiple recesses can be etched in the metal plate to form multiple posts and the base, then the adhesive tape and the substrate (with a single conductive layer and a single dielectric layer) with respective openings and apertures corresponding to the posts can be mounted on the base such that each post extends through an opening into an aperture, then the base and the substrate can be moved towards one another by platens to apply pressure to the adhesive tape to attach the base to the substrate, then the conductive layer can be etched to form the conductive traces with the pads and the terminals corresponding to the posts, then the solder mask can be deposited over the conductive traces and into the gaps in the apertures between the posts and the substrate, then the solder mask can be solidified and patterned to expose the posts, the pads and the terminals, then the plated contact surface finish can be formed on the base, the posts, the pads and the terminals and then the base, the substrate, the adhesive tape and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the posts and the pads, then the LED packages can be placed on the solder paste portions, then the solder paste portions can be simultaneously heated, reflowed and hardened to provide the solder joints, and then the thermal boards can be separated from one another.

As another example, die attach paste portions can be deposited on the posts, then the chips can be placed on the die attach paste portions, then the die attach paste portions can be simultaneously heated and hardened to provide the die attaches, then the chips can be wired bonded to the corresponding pads, then the encapsulant can be formed over the chips and the wire bonds, and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as a die attach is between the semiconductor device and the post and is intersected by the line, and regardless of whether another imaginary vertical line intersects the semiconductor device but not the post (outside the periphery of the post). Likewise, the adhesives overlap the base, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the base, and the conductive layer can be a patterned circuit with spaced traces on the dielectric layer when the semiconductor device is mounted on the heat spreader. Furthermore, a layer can include stacked layers.

The term "deform" refers to shape change. For instance, the pressure-sensitive adhesive tape is deformed by the pressure that securely fastens it to the base regardless of whether its shape changes only slightly and it essentially retains its original shape.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The terms "opening" and "aperture" refer to a through-hole and are synonymous. For instance, the opening extends through the first adhesive and the aperture extends through the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the substrate is mounted on the base regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach. Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink. Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
    a semiconductor device;
    a heat spreader that includes a post and a base, wherein the post is adjacent to the base and extends above the base in an upward direction, and the base extends below the post in a downward direction opposite the upward direction and extends laterally from the post in lateral directions orthogonal to the upward and downward directions;
    a first adhesive and a second adhesive, wherein the first adhesive includes a first opening, contacts the second adhesive at an adhesive interface and extends laterally from the adhesive interface in the lateral directions, and the second adhesive includes a second opening and extends upwardly from the adhesive interface above the first adhesive in the upward direction; and
    a conductive trace that includes a pad and a terminal;
    wherein the semiconductor device is mounted on the heat spreader, overlaps the post, is electrically connected to the pad and thereby electrically connected to the terminal, and is thermally connected to the post and thereby thermally connected to the base;
    wherein the first adhesive is mounted on and extends above the base, extends between the conductive trace and the base and extends laterally from the adhesive interface to or beyond the terminal;
    wherein the second adhesive extends above the post and the conductive trace, extends below the pad, extends between the post and the pad, overlaps the conductive trace, does not overlap the semiconductor device, does not cover the pad in the upward direction and extends laterally from the post to or beyond the terminal;
    wherein the pad is mounted on the first adhesive and extends above the base; and
    wherein the post extends through the first opening and into the second opening, and the base extends below the semiconductor device and the pad.

2. The assembly of claim 1, wherein the semiconductor device is an LED package that includes an LED chip.

3. The assembly of claim 2, wherein the LED package is electrically connected to the pad using a first solder joint and is thermally connected to the heat spreader using a second solder joint.

4. The assembly of claim 1, wherein the semiconductor device is a semiconductor chip.

5. The assembly of claim 4, wherein the chip is electrically connected to the pad using a wire bond and is thermally connected to the heat spreader using a die attach.

6. The assembly of claim 1, wherein the first adhesive extends to peripheral edges of the assembly.

7. The assembly of claim 1, wherein the second adhesive extends to peripheral edges of the assembly.

8. The assembly of claim 1, wherein the first adhesive is an adhesive tape and the second adhesive is a solder mask for the conductive trace and the heat spreader that selectively exposes the pad to electrical connection media that electrically connects the semiconductor device and the pad and selectively exposes the post to thermal connection media that thermally connects the semiconductor device and the post.

9. The assembly of claim 1, wherein the first adhesive contacts the base outside the gap and the second adhesive contacts the post in the gap.

10. The assembly of claim 1, wherein the first adhesive conformally coats a top surface of the base outside the post and the second adhesive conformally coats sidewalls of the post.

11. The assembly of claim 1, wherein the first adhesive surrounds the post in the lateral directions, the second adhesive surrounds the post in the lateral directions and the first and second adhesives in combination cover the post in the lateral directions.

12. The assembly of claim 1, wherein the post is integral with the base.

13. The assembly of claim 1, wherein the post is coplanar with the first adhesive at the base.

14. The assembly of claim 1, wherein the post has a diameter that decreases as it extends upwardly from the base to its flat top.

15. The assembly of claim 1, wherein the base covers the semiconductor device, the post, the conductive trace and the adhesives in the downward direction and extends to peripheral edges of the assembly.

16. A semiconductor chip assembly, comprising:
a semiconductor device;
a heat spreader that includes a post and a base, wherein the post is adjacent to the base and extends above the base in an upward direction, and the base extends below the post in a downward direction opposite the upward direction and extends laterally from the post in lateral directions orthogonal to the upward and downward directions;
a first adhesive and a second adhesive, wherein the first adhesive includes a first opening, contacts the second adhesive at an adhesive interface and extends laterally from the adhesive interface in the lateral directions, and the second adhesive includes a second opening and extends upwardly from the adhesive interface above the first adhesive in the upward direction;
a substrate that includes a dielectric layer, wherein an aperture extends through the substrate; and
a conductive trace that includes a pad and a terminal;
wherein the semiconductor device is mounted on the heat spreader, overlaps the post, is electrically connected to the pad and thereby electrically connected to the terminal, and is thermally connected to the post and thereby thermally connected to the base;
wherein the first adhesive is mounted on and extends above the base, extends laterally from the post to or beyond the terminal and is sandwiched between the base and the substrate;
wherein the second adhesive extends into a gap in the aperture between the post and the substrate, extends laterally from the post to or beyond the terminal, is sandwiched between the post and the dielectric layer, overlaps the conductive trace and does not overlap the semiconductor device;
wherein the substrate is mounted on the first adhesive and the dielectric layer extends above the base;
wherein the pad is mounted on and extends above the dielectric layer; and
wherein the post extends through the first opening and into the second opening and into the aperture, and the base extends below the semiconductor device, the substrate and the adhesives.

17. The assembly of claim 16, wherein the semiconductor device is an LED package that includes an LED chip, is mounted on the pad using a first solder joint and on the post using a second solder joint, is electrically connected to the pad using the first solder joint and is thermally connected to the post using the second solder joint.

18. The assembly of claim 16, wherein the semiconductor device is a semiconductor chip that is electrically connected to the pad using a wire bond and is thermally connected to the post using a die attach.

19. The assembly of claim 16, wherein the first adhesive is an adhesive tape and the second adhesive is a solder mask for the conductive trace that selectively exposes the pad in the upward direction and does not cover the pad in the upward direction.

20. The assembly of claim 16, wherein the first adhesive extends in a lateral direction away from the post beyond the conductive trace to peripheral edges of the assembly and the second adhesive extends in a lateral direction away from the post beyond the conductive trace to peripheral edges of the assembly.

21. The assembly of claim 16, wherein the first adhesive contacts the base and the dielectric layer outside the gap and the second adhesive contacts the post and the dielectric layer in the gap.

22. The assembly of claim 16, wherein the first adhesive surrounds the post in the lateral directions, the second adhesive surrounds the post in the lateral directions and the first and second adhesives in combination cover the post in the lateral directions.

23. The assembly of claim 16, wherein the adhesive interface laterally surrounds the post.

24. The assembly of claim 16, wherein the adhesive interface is proximate to a corner of the heat spreader between the post and the base.

25. The assembly of claim 16, wherein the substrate contacts the adhesives, is spaced from the post and the base and is a laminated structure.

26. The assembly of claim 16, wherein the conductive trace contacts the dielectric layer and the second adhesive and is spaced from the post, the base and first adhesive, and the dielectric layer contacts the adhesives and is spaced from the post and the base.

27. The assembly of claim 16, wherein the pad is coplanar with the terminal above the dielectric layer.

28. The assembly of claim 16, wherein the post is coplanar with the first adhesive below the dielectric layer at the base.

29. The assembly of claim 16, wherein the post has a diameter that decreases as it extends upwardly from the base to its flat top.

30. The assembly of claim 16, wherein the base covers the semiconductor device, the post, the substrate and the adhesives in the downward direction and extends to peripheral edges of the assembly.

31. The assembly of claim 16, wherein the semiconductor device extends above the second adhesive.

32. The assembly of claim 16, wherein the post extends above the dielectric layer.

33. The assembly of claim 16, wherein the second adhesive is a solder mask for the conductive trace that selectively exposes the pad and the terminal in the upward direction and does not cover the pad and the terminal in the upward direction.

34. The assembly of claim 16, wherein the second adhesive is a solder mask for the conductive trace and the heat spreader that selectively exposes the pad and the post in the upward direction and does not cover the pad and the post in the upward direction.

35. The assembly of claim 16, wherein the second adhesive is a solder mask for the conductive trace that selectively exposes the pad to electrical connection media that electrically connects the semiconductor device and the pad.

36. The assembly of claim 16, wherein the second adhesive is a solder mask for the heat spreader that selectively exposes the post to thermal connection media that thermally connects the semiconductor device and the post.

37. The assembly of claim 16, wherein the second adhesive is a solder mask for the conductive trace and the heat spreader that selectively exposes the pad to electrical connection media that electrically connects the semiconductor device and the pad and selectively exposes the post to thermal connection media that thermally connects the semiconductor device and the post.

38. The assembly of claim 16, wherein:
the first adhesive is an adhesive tape that contacts the base and the dielectric layer outside the gap and surrounds the post in the lateral directions;
the second adhesive is a solder mask for the conductive trace and the heat spreader that contacts the post and the dielectric layer in the gap, surrounds the post in the lateral directions, selectively exposes the pad to electrical connection media that electrically connects the semiconductor device and the pad and selectively exposes the post to thermal connection media that thermally connects the semiconductor device and the post; and
the adhesives extend to peripheral edges of the assembly and in combination cover the post in the lateral directions.

39. The assembly of claim 38, wherein the semiconductor device extends above the second adhesive and the post extends above the dielectric layer.

40. The assembly of claim 39, wherein:
the conductive trace contacts the dielectric layer and the second adhesive and is spaced from the post, the base and first adhesive;
the dielectric layer contacts the adhesives and is spaced from the post and the base; and
the base covers the semiconductor device, the post, the substrate and the adhesives in the downward direction and extends to peripheral edges of the assembly.

41. A semiconductor chip assembly, comprising:
a semiconductor device;
a heat spreader that includes a post and a base, wherein the post is adjacent to and integral with the base and extends above the base in an upward direction, and the base extends below the post in a downward direction opposite the upward direction and extends laterally from the post in lateral directions orthogonal to the upward and downward directions;
a first adhesive and a second adhesive, wherein the first adhesive includes a first opening, contacts the second adhesive at an adhesive interface and extends laterally from the adhesive interface in the lateral directions, and the second adhesive includes a second opening and extends upwardly from the adhesive interface above the first adhesive in the upward direction; and
a substrate that includes a pad, a terminal, a routing line and a dielectric layer, wherein the pad, the terminal and the routing line contact and extend above the dielectric layer, an electrically conductive path between the pad and the terminal includes the routing line, and an aperture extends through the substrate;
wherein the semiconductor device is mounted on and overlaps the post, extends above the adhesives, is electrically connected to the pad and thereby electrically connected to the terminal, and is thermally connected to the post and thereby thermally connected to the base;
wherein the first adhesive is mounted on and extends above the base, is sandwiched between the base and the substrate, surrounds the post in the lateral directions, is overlapped by the pad, the terminal and the routing line and extends to peripheral edges of the assembly;
wherein the second adhesive extends above the conductive trace and the heat spreader, extends below the pad, extends into a gap in the aperture between the post and the substrate, extends across most or all of the dielectric layer in the gap, is sandwiched between the post and the dielectric layer in the gap, surrounds the post in the lateral directions, overlaps the routing line, does not overlap the semiconductor device, extends laterally from the post to or beyond the terminal and extends to peripheral edges of the assembly;
wherein the substrate is mounted on the first adhesive and the dielectric layer extends above the base; and
wherein the post extends through the first opening and into the second opening and into the aperture and above the dielectric layer, and the base extends below the semiconductor device, the substrate and the adhesives, covers the semiconductor device, the post, the substrate and the adhesives in the downward direction and extends to peripheral edges of the assembly.

42. The assembly of claim 41, wherein the semiconductor device is an LED package that includes an LED chip, is mounted on the pad using a first solder joint and on the post using a second solder joint, is electrically connected to the pad using the first solder joint and is thermally connected to the post using the second solder joint.

43. The assembly of claim 41, wherein the first adhesive is an adhesive tape and the second adhesive is a solder mask for the conductive trace and the heat spreader that selectively exposes the pad, the terminal and the post in the upward direction and does not cover the pad, the terminal and the post in the upward direction.

44. The assembly of claim 41, wherein the first adhesive contacts the base and the dielectric layer outside the gap, the second adhesive contacts the post and the dielectric layer in the gap and the adhesive interface laterally surrounds the post and is proximate to a corner of the heat spreader between the post and the base.

45. The assembly of claim 41, wherein the post has a diameter that decreases as it extends upwardly from the base to its flat top and the post is coplanar with the first adhesive below the dielectric layer at the base.

* * * * *